(12) United States Patent
Takagi et al.

(10) Patent No.: US 9,623,653 B2
(45) Date of Patent: *Apr. 18, 2017

(54) DRIVING CIRCUIT FOR DRIVING A CAPACITIVE LOAD

(71) Applicant: Seiko Epson Corporation, Tokyo (JP)

(72) Inventors: Tetsuo Takagi, Okaya (JP); Hidekazu Uematsu, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/166,483

(22) Filed: May 27, 2016

(65) Prior Publication Data

US 2016/0271939 A1   Sep. 22, 2016

Related U.S. Application Data

(63) Continuation of application No. 14/818,614, filed on Aug. 5, 2015, now Pat. No. 9,375,917.

(30) Foreign Application Priority Data

Aug. 12, 2014   (JP) ................................ 2014-164131

(51) Int. Cl.
*B41J 2/045* (2006.01)
*H03K 17/687* (2006.01)

(52) U.S. Cl.
CPC ......... *B41J 2/04541* (2013.01); *B41J 2/0455* (2013.01); *B41J 2/04581* (2013.01); *H03K 17/687* (2013.01); *B41J 2202/11* (2013.01)

(58) Field of Classification Search
CPC .......................... B41J 2/04541; B41J 2/04581
See application file for complete search history.

(56) References Cited

U.S. PATENT DOCUMENTS

2014/0285579 A1   9/2014   Oshima et al.
2014/0354352 A1   12/2014  Noro

FOREIGN PATENT DOCUMENTS

JP    2010-114711 A    5/2010
JP    2013-118628 A    6/2013

*Primary Examiner* — Julian Huffman
(74) *Attorney, Agent, or Firm* — Harness, Dickey & Pierce, P.L.C.

(57) ABSTRACT

A drive circuit for driving a capacitive load is provided. The drive circuit includes a modulation circuit that generates a modulated signal by pulse-modulating a source signal through self-oscillation; a pair of transistors that include a high-side transistor and a low-side transistor and amplify the modulated signal to generate an amplified modulated signal; and a low-pass filter that includes a capacitor and smoothes the amplified modulated signal to generate a drive signal which is applied to the capacitive load, wherein the shortest distance between a low-side transistor and the capacitor is shorter than a shortest distance between the high-side transistor and the capacitor.

5 Claims, 17 Drawing Sheets

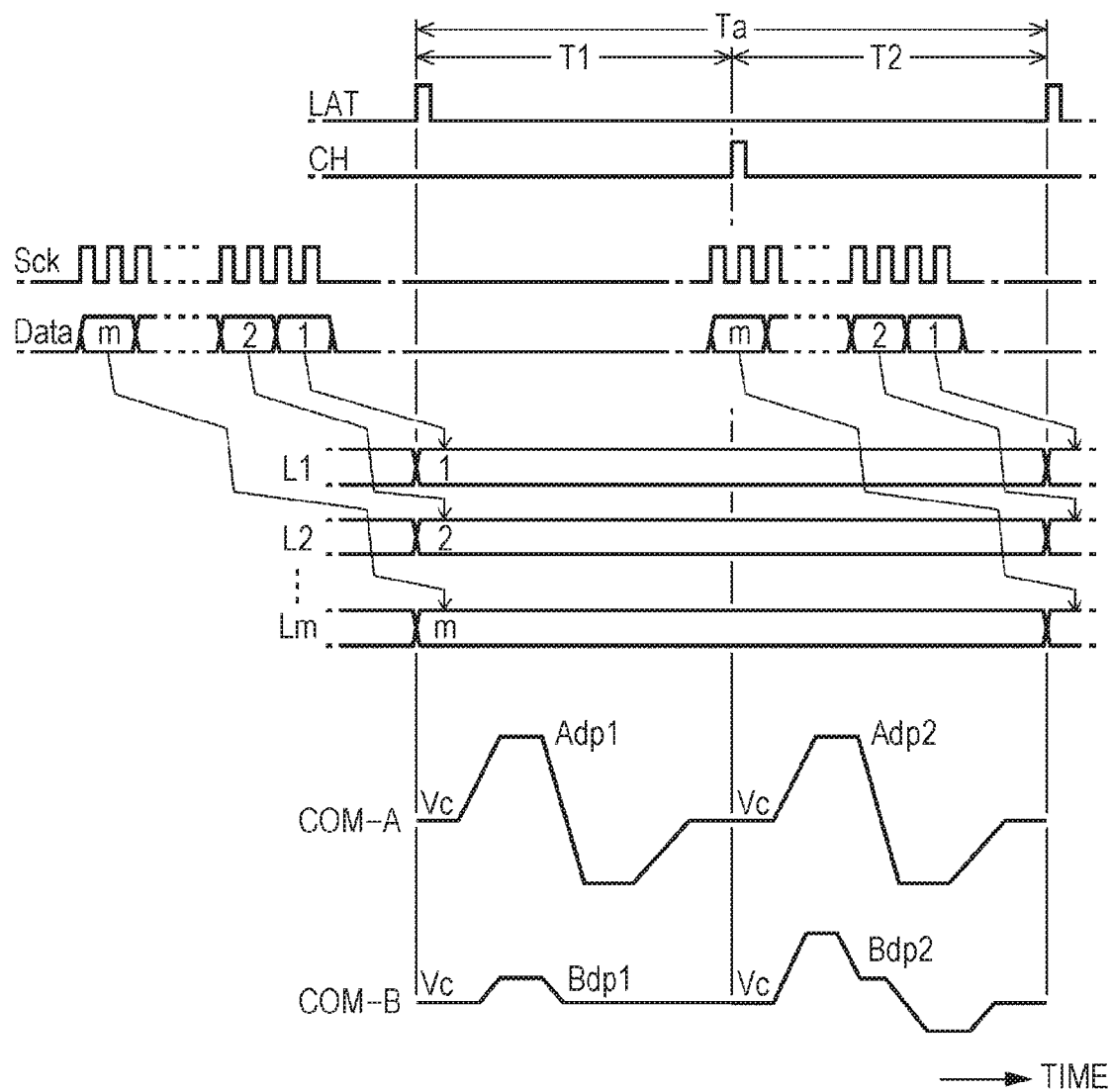

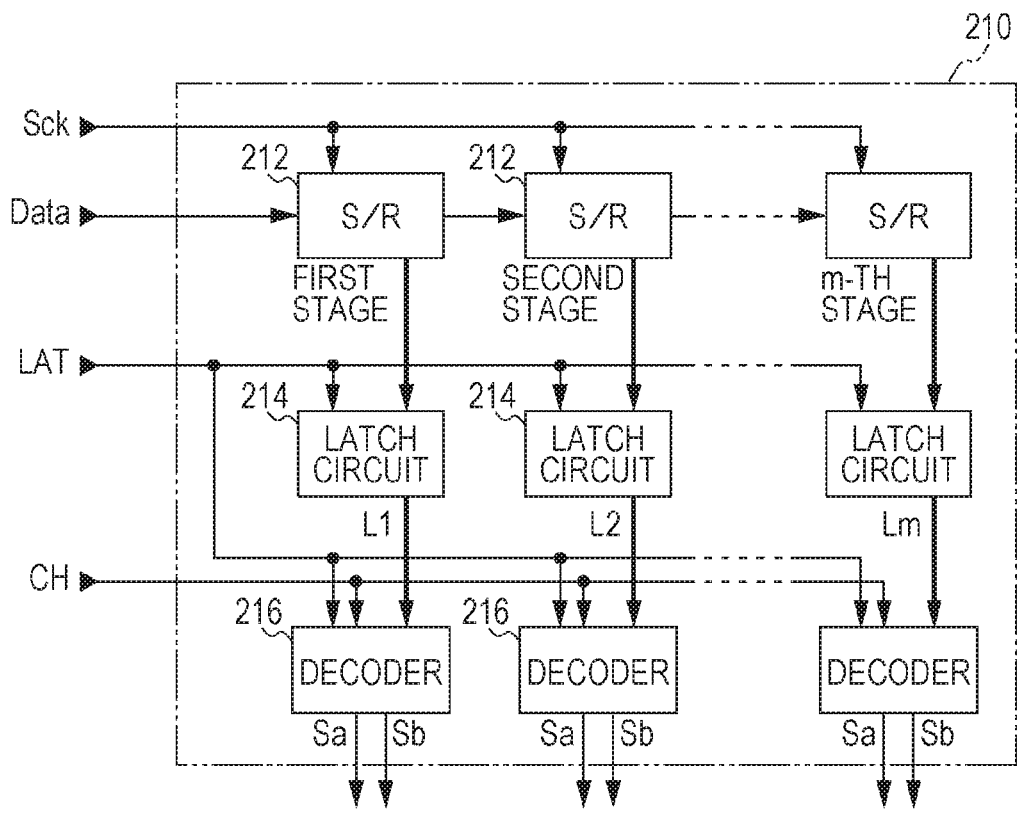

<SELF-OSCILLATION FREQUENCY CHARACTERISTICS>

<FREQUENCY DISPERSION>

<WIRING PATTERN>

<ARRANGEMENT OF ELEMENTS (RELATIONSHIP WITH WIRING PATTERN)>

DRIVING CIRCUIT FOR DRIVING A CAPACITIVE LOAD

CROSS-REFERENCE TO RELATED APPLICATIONS

This is a continuation application of U.S. application Ser. No. 14/818,614, filed on Aug. 5, 2015, which claims priority to Japanese Patent Application No. 2014-164131, filed on Aug. 12, 2014. Both applications are expressly incorporated by reference herein in their entireties.

BACKGROUND

1. Technical Field

The present invention relates to a driving circuit for driving a capacitive load.

2. Related Art

As an ink jet printer that discharges an ink and prints an image or a document, a printer that uses piezoelectric elements (for example, piezo elements) is known. The piezoelectric elements are provided respectively corresponding to a plurality of nozzles in a head unit and are respectively driven in response to drive signals and thereby, a predetermined amount of an ink (liquid) is discharged from the nozzle at a predetermined timing such that a dot is formed. The piezoelectric element is a capacitive load like a capacitor in terms of electric power. Therefore, a sufficient current supply is required to operate the piezoelectric elements of the nozzles.

Therefore, a configuration is employed, in which a drive signal amplified by using an amplifier circuit is supplied to a head unit such that the piezoelectric element is driven. Examples of the amplifier circuit include an amplifier circuit having a system of performing current amplification of a source signal before amplification through class AB amplification or the like. However, since the system is poor in energy efficiency, class D amplification has been proposed recently (see JP-A-2010-114711).

In order to stabilize a frequency of self-oscillation in such class D amplification, a technique in which a phase locked loop (PLL) is provided in a feedback path for the self-oscillation such that a frequency of a signal of the self-oscillation is caused to approximate to a frequency of a reference signal has been proposed (see JP-A-2013-118628).

Incidentally, in the configuration in which the PLL is provided in the feedback path (loop) of the self-oscillation, an oscillation circuit for generating the reference signal is separately required, which results in complication of the circuit.

SUMMARY

In accordance with the teachings of the claimed invention, a drive circuit for driving a capacitive load is provided. The drive circuit includes a modulation circuit that generates a modulated signal by pulse-modulating a source signal through self-oscillation; a pair of transistors that include a high-side transistor and a low-side transistor and amplify the modulated signal to generate an amplified modulated signal; and a low-pass filter that includes a capacitor and smoothes the amplified modulated signal to generate a drive signal which is applied to the capacitive load, wherein the shortest distance between a low-side transistor and the capacitor is shorter than a shortest distance between the high-side transistor and the capacitor.

An advantage of some aspects of the invention is to provide a technique which allows class D amplification of a source signal and preventing deterioration in print quality in a liquid discharge apparatus that performs class D amplification of a drive signal that is applied to a piezoelectric element, with a relatively simple configuration.

According to an aspect of the invention, there is provided a liquid discharge apparatus including: a modulation circuit that generates a modulated signal by pulse-modulating a source signal through self-oscillation; a pair of transistors that include a high-side transistor and a low-side transistor and amplify the modulated signal to generate an amplified modulated signal; a low-pass filter that includes an inductor and a capacitor and smoothes the amplified modulated signal to generate a drive signal; a piezoelectric element that is displaced by application of the drive signal thereto; a cavity that is filled with a liquid inside and has an internal volume which changes when the piezoelectric element is displaced; and a nozzle that is provided to discharge the liquid inside the cavity in response to the change of the internal volume of the cavity, in which the shortest distance between the low-side transistor and the capacitor is shorter than the shortest distance between the high-side transistor and the capacitor.

In this case, since no separate oscillation circuit is required, it is possible to prevent deterioration of print quality with a relatively simple configuration.

In addition, as the liquid discharge apparatus according to the aspect, when the shortest distance between the low-side transistor and the capacitor is shorter than the shortest distance between the high-side transistor and the capacitor, wiring impedance between the low-side transistor and the capacitor, that is, more exactly, an impedance component which parasitizes the capacitor becomes lower and occurrence of abnormality of the self-oscillation (for example, oscillation at a frequency twice the expected frequency), a variation in the frequency, or the like is suppressed.

Here, the shortest distance means, for example, a distance from the (opposite) center point of an element in a plane view, to the center point of the counterpart element in a plan view in a state where the elements are mounted on a circuit board. In addition, the source signal means a signal which becomes a source of the drive signal that defines a displacement of the piezoelectric element, that is, a signal before the modulation which serves as a reference of a waveform of the drive signal (including a signal defining the waveform regardless of being analog or digital). The modulated signal means a digital signal that is obtained by pulse-modulation (for example, pulse-width modulation or pulse-density modulation) of the source signal.

Incidentally, in the liquid discharge apparatus according to the aspect, the amplified modulated signal is smoothed such that the drive signal is generated and the piezoelectric element is displaced by the application of the drive signal such that the liquid is discharged from the nozzle. Here, when a frequency spectral analysis is performed on the waveform of the drive signal for causing the liquid discharge apparatus to discharge a small dot, for example, it turns out that a frequency component equal to or higher than kHz is contained. In order to generate a drive signal including such a frequency component equal to or higher than 50 kHz, the frequency (frequency of the modulated signal) of the self-oscillation needs to be 1 MHz or higher.

If the frequency is lower than 1 MHz, an edge of the waveform of the reproduced drive signal is blunt and round. In other words, the waveform is blunt without a sharp corner. When the waveform of the drive signal has the blunt edge, the piezoelectric element which operates in accordance with a rising or falling edge of the waveform is gradually displaced and tailing or discharge failure during discharge occurs such that quality of the printing deteriorates.

Meanwhile, when the frequency of the self-oscillation is higher than 8 MHz, resolution of the waveform of the drive signal becomes higher. However, an increase of a switching frequency in the transistor results in a great switching loss, and power-saving performance and heat saving performance better than in a linear amplification such as the class AB amplification or the like are lost.

Therefore, it is preferable that a frequency of the self-oscillation is from 1 MHz to 8 MHz.

In the liquid discharge apparatus, it is preferable that inductance including parasitic inductance of the capacitor and wiring inductance from the capacitor to the low-side transistor is 1 nH or lower. In this configuration, a factor causing the self-oscillation to be unstable is removed.

In addition, in the liquid discharge apparatus, it is preferable that a self-resonant frequency of the capacitor is higher than a frequency of the self-oscillation. In this manner, when the self-resonant frequency of the capacitor is higher than the frequency of the self-oscillation, it is possible to prevent occurrence of abnormal oscillation, a variation in the frequency of the self-oscillation, or the like.

In the liquid discharge apparatus, it is preferable that a self-resonant frequency of the capacitor is 1.5 or more times a frequency of the self-oscillation. In this manner, when the self-resonant frequency of the capacitor is 1.5 or more times the frequency of the self-oscillation, it is possible to prevent occurrence of abnormal oscillation, a variation in the frequency of the self-oscillation, or the like.

The invention can be realized in various aspects such as a single head unit.

BRIEF DESCRIPTION OF THE DRAWINGS

The invention will be described with reference to the accompanying drawings, wherein like numbers reference like elements.

FIG. 5 is an explanatory diagram of an operation of a selection controller in the head unit.

FIG. 6 is a diagram illustrating a configuration of the selection controller in the head unit.

FIG. 7 is a diagram showing decoded details of a decoder in the head unit.

DESCRIPTION OF EXEMPLARY EMBODIMENTS

Hereinafter, embodiments of the invention will be described with reference to the drawings.

A printing apparatus according to the embodiment is an ink jet printer, that is, a liquid discharge apparatus, which discharges an ink in accordance with image data supplied from an external host computer such that an ink dot group is formed on a printing medium such as paper, and thereby prints an image (including a text, a figure, or the like) in accordance with the image data.

Figure 1:
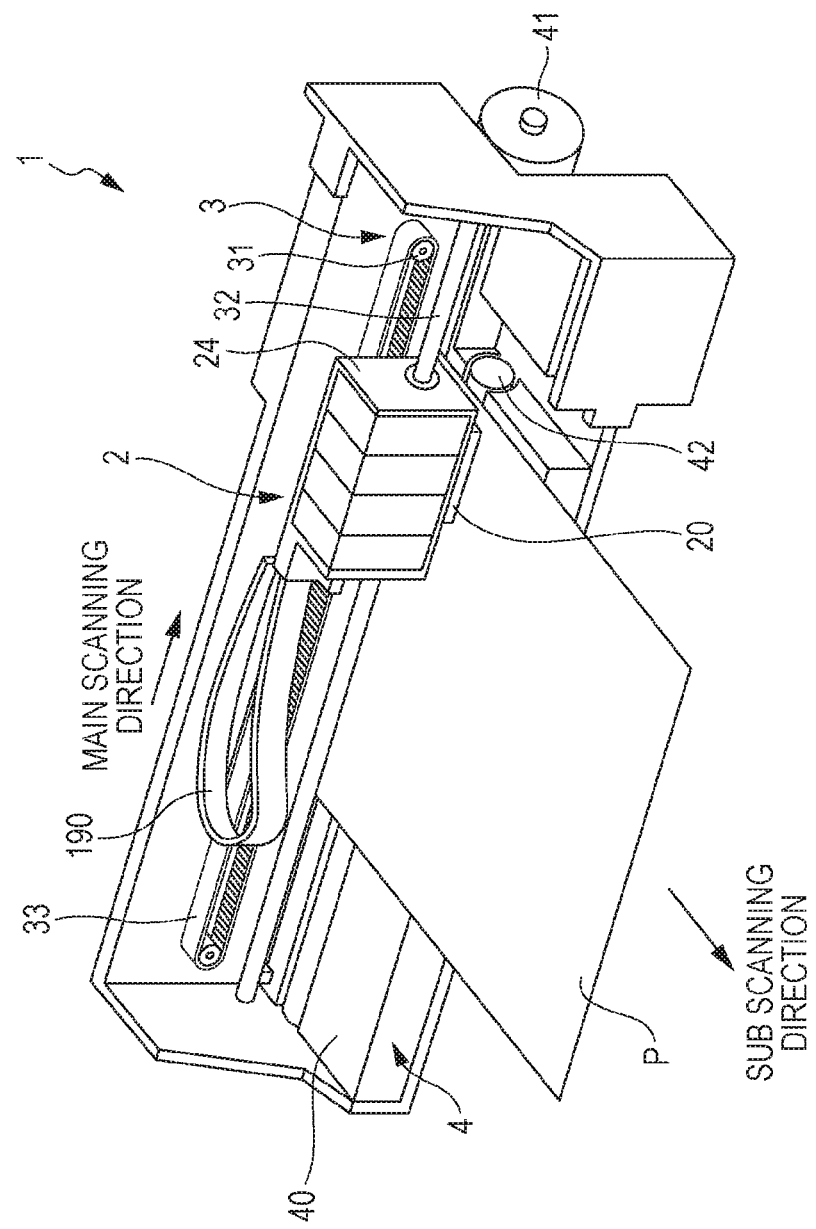
FIG. 1 is a view schematically illustrating a configuration of a printing apparatus.

FIG. 1 is a perspective view schematically illustrating an internal configuration of a printing apparatus.

As illustrated in FIG. 1, the printing apparatus 1 includes a traveling mechanism 3 that causes a traveling body 2 to travel (reciprocate) in a main scanning direction.

The traveling mechanism 3 has a carriage motor 31 that is a drive source of the traveling body 2, a carriage guide shaft 32 having both ends which are fixed, and a timing belt 33 that extends to be substantially parallel to the carriage guide shaft 32 and is driven by the carriage motor 31.

A carriage 24 of the traveling body 2 is supported by the carriage guide shaft 32 in a freely reciprocating manner and is fixed to a part of the timing belt 33. Therefore, when the carriage motor 31 causes the timing belt 33 to travel forward and reversely, the traveling body 2 is guided by the carriage guide shaft 32 so as to reciprocate.

In addition, a head unit 20 is provided at a portion of the traveling body 2, which faces a printing medium P. As will be described below, the head unit 20 discharges an ink droplet (liquid droplet) from many nozzles and has a configuration in which various control signals or the like are supplied through a flexible cable 190.

The printing apparatus 1 includes a transport mechanism 4 which causes the printing medium P to be transported onto a platen 40 in a sub scanning direction. The transport mechanism 4 includes a transport motor 41 which is a drive source and a transport roller 42 that is caused to rotate by the transport motor 41 and transports the printing medium P in the sub scanning direction.

At a timing at which the printing medium P is transported by the transport mechanism 4, the head unit 20 discharges the ink droplet onto the printing medium P and thereby, an image is formed on a surface of the printing medium P.

Figure 2:
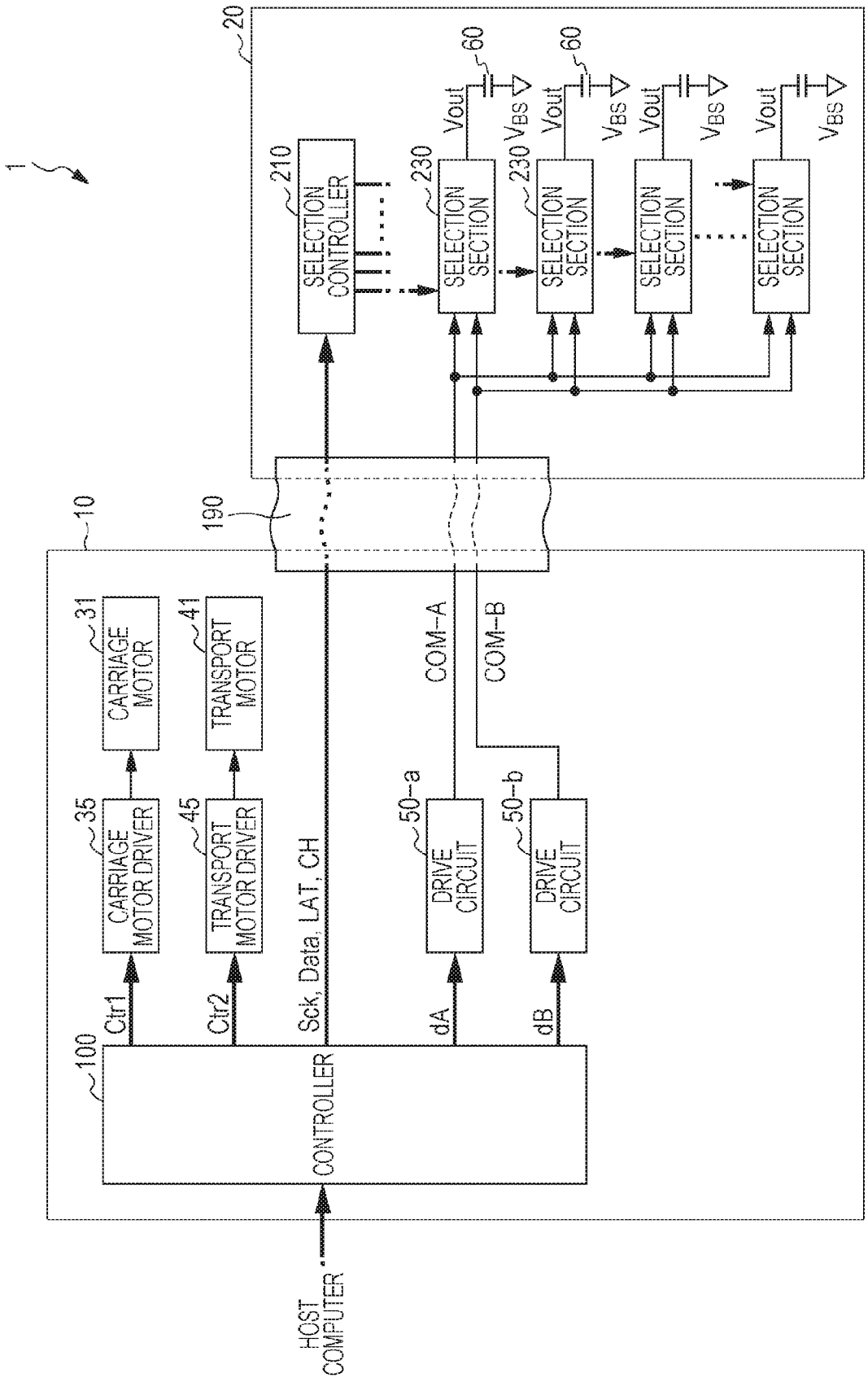
FIG. 2 is a block diagram illustrating a configuration of the printing apparatus.

FIG. 2 is a block diagram illustrating an electrical configuration of the printing apparatus.

As illustrated in FIG. 2, in the printing apparatus 1, the control unit 10 and the head unit 20 are connected through the flexible cable 190.

The control unit 10 includes a controller 100, the carriage motor 31, a carriage motor driver 35, the transport motor 41, a transport motor driver 45, and two drive circuits 50-a and 50-b. Among them, when the image data is supplied from the host computer, the controller 100 outputs various control signals or the like to control the elements.

To be more specific, first, the controller 100 supplies a control signal Ctr1 to the carriage motor driver 35 and the carriage motor driver 35 drives the carriage motor 31 in response to the control signal Ctr1. Accordingly, travelling of the carriage 24 in the main scanning direction is controlled.

Second, the controller 100 supplies a control signal Ctr2 to the transport motor driver 45 and the transport motor driver 45 drives the transport motor 41 in response to the control signal Ctr2. Accordingly, travelling by the transport mechanism 4 in the sub scanning direction is controlled.

Third, the controller 100 supplies digital data dA to one drive circuit 50-a and supplies digital data dB to the other drive circuit 50-b, of the two drive circuits 50-a and 50-b. Here, the data dA defines a waveform of a drive signal COM-A and the data dB defines a waveform of a drive signal COM-B, among the drive signals supplied to the head unit 20.

The details will be described below and, in brief, after the drive circuit 50-a performs analog conversion of the data dA, the drive circuit 50-a supplies the drive signal COM-A which has been subjected to class D amplification to the head unit 20. Similarly, after the drive circuit 50-b performs analog conversion of the data dB, the drive circuit 50-b supplies the drive signal COM-B which has been subjected to class D amplification to the head unit 20. In addition, the drive circuits 50-a and 50-b are different only in that the data to be input and the drive signal to be output are different but have the same circuit configuration as will be described below. Therefore, in a case where there is no need to particularly distinguish the drive circuits 50-a and 50-b (for example, in a case of describing FIG. 10), hyphens and subsequent letters are omitted and, description is provided with a simple reference sign of "50".

Fourth, the controller 100 supplies a clock signal Sck, a data signal Data, and control signals LAT and CH to the head unit 20.

A plurality of sets of a selection controller 210, a selection section 230, and a piezoelectric element (piezo element) 60 are provided in the head unit 20.

The selection controller 210 instructs which to select (or no selection) from the drive signals COM-A and COM-B for each of the selection sections 230 in the control signal or the like supplied from the controller 100, the selection section 230 selects the drive signals COM-A and COM-B in response to the instruction of the selection controller 210, and the selected signal is supplied to one end of each of the piezoelectric elements 60 as the drive signal. In the drawing, a voltage of the drive signal is referred to as Vout.

In this example, a voltage $V_{BS}$ is commonly applied to the other end in each of the piezoelectric elements 60.

The piezoelectric elements 60 are provided corresponding to the plurality of nozzles in the head unit 20. Thus, the piezoelectric element 60 is displaced in accordance with a difference between the voltage Vout of the drive signal selected by the selection section 230 and the voltage $V_{BS}$ and causes the ink to be discharged. Next, a configuration for discharging the ink by driving the piezoelectric element 60 will be described concisely.

Figure 3:
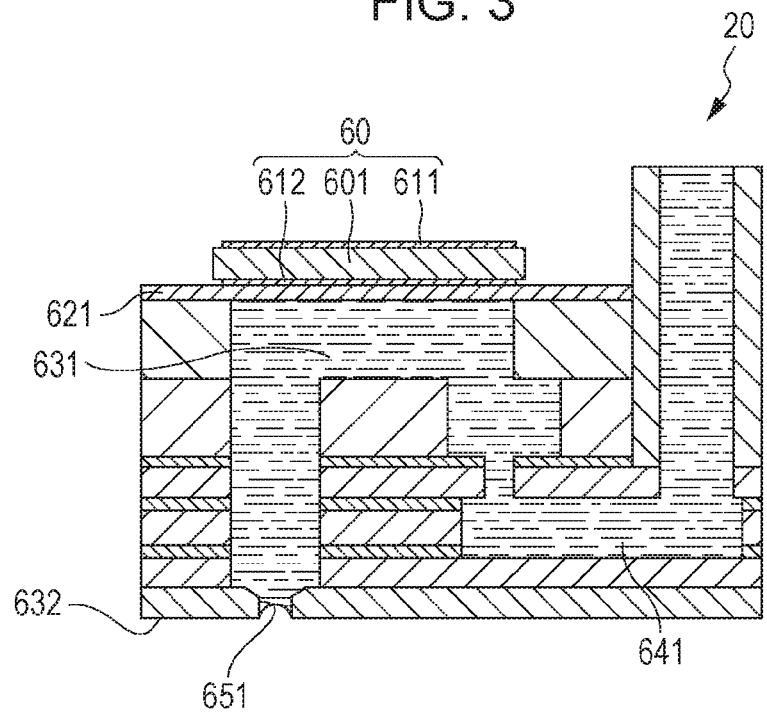
FIG. 3 is a view illustrating a configuration of a discharge section in a head unit.

FIG. 3 is a view schematically illustrating a configuration corresponding to one nozzle in the head unit 20.

As illustrated in FIG. 3, the head unit 20 includes the piezoelectric element 60, a vibration plate 621, a cavity (pressure chamber) 631, a reservoir 641, and a nozzle 651. Among them, the vibration plate 621 is deformed (flexurally vibrated) by the piezoelectric element 60 provided on the top surface in FIG. 3 and functions as a diaphragm that causes an internal volume of the cavity 631 which is filled with the ink to expand/contract. The nozzle 651 is provided in a nozzle plate 632 and is an opening which communicates with the cavity 631.

The piezoelectric element 60 illustrated in FIG. 3 has a structure in which a piezoelectric body 601 is interposed between a pair of electrodes 611 and 612. The central portion of the piezoelectric body 601 in the structure is bent in the vertical direction with respect to both end portions in FIG. 3 depending on the voltage applied by the electrodes 611 and 612 along with the electrodes 611 and 612 and the vibration plate 621. Specifically, the piezoelectric element 60 is configured to be bent upwardly when the voltage Vout of the drive signal becomes high and to be bent downwardly when the voltage Vout becomes low. In this configuration, the upward bending causes the internal volume of the cavity 631 to expand, and thus the ink is caused to be gathered from the reservoir 641 and the downward bending causes the internal volume of the cavity 631 to contract, and thus the ink is caused to be discharged from the nozzle 651 depending on a degree of the contraction.

The piezoelectric element 60 is not limited to the structure illustrated in FIG. 3 and may be a type in which the piezoelectric element 60 is caused to deform such that a liquid such as an ink can be discharged. In addition, the piezoelectric element 60 is not limited to the configuration in which the flexural vibration is used, but may have a configuration in which longitudinal vibration is used.

In addition, the piezoelectric element 60 is provided corresponding to the cavity 631 and the nozzle 651 in the head unit 20 and the piezoelectric element 60 is provided corresponding to the selection section 230 in FIG. 1. Therefore, a set of the piezoelectric element 60, the cavity 631, the nozzle 651, and the selection section 230 is provided for each nozzle 651.

Figure 4A:
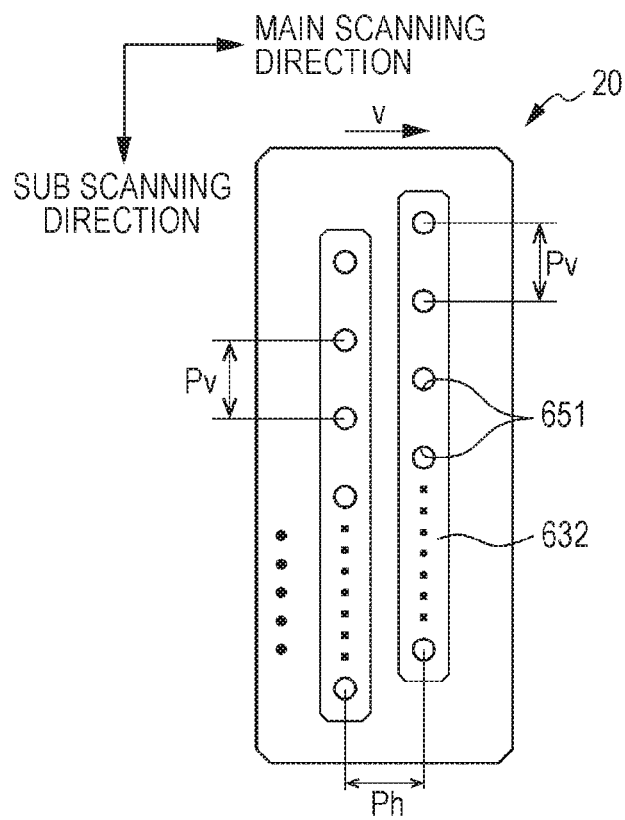
FIGS. 4A and 4B are views illustrating a nozzle array in the head unit.

FIG. 4A is a view illustrating an example of an array of the nozzles 651.

As illustrated in FIG. 4A, the nozzles 651 are arranged in two rows, for example. To be more specific, regarding one row, the plurality of nozzles 651 are disposed at a pitch Pv in the sub scanning direction, and the two rows are separated from each other at a pitch Ph in the main scanning direction and have a relationship in which one row is shifted with respect to the other row by half the pitch Pv in the sub scanning direction.

In a case of color printing, the nozzles 651 have a pattern to be provided corresponding to each color such as cyan (C), magenta (M), yellow (Y), and black (K) in the main scanning direction, but in the following description, for the sake of simplification, a case in which a tone is shown in a single color will be described.

Figure 4B:
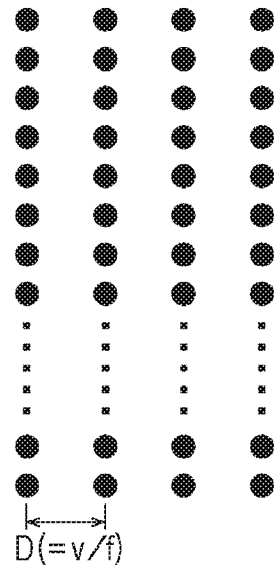

FIG. 4B is an explanatory view of basic resolution to form an image by the nozzle array illustrated in FIG. 4A. For the sake of simplification, FIG. 4B illustrates an example of a method (first method) in which an ink droplet is discharged once from the nozzle 651 and one dot is formed and black circles represent dots formed by landing of ink droplets.

As illustrated in FIG. 4B, when the head unit 20 travels in the main scanning direction at a velocity v, a distance D (in the main scanning direction) between the dots formed by landing of the ink droplets and the velocity v have a relationship as follows.

That is, in a case where an ink droplet is discharged once and one dot is formed, the dot distance D is represented by a value (=v/f) obtained by dividing the velocity v by an ink discharge frequency f, in other words, a traveling distance of the head unit 20 in a cycle (1/f) in which the ink droplets are repeatedly discharged.

In the examples in FIGS. 4A and 4B, the pitch Ph is proportional to the dot distance D by a coefficient n and the ink droplets discharged from the two rows of the nozzles 651 are caused to land on the printing medium P such that the ink droplets are aligned in the same row. Therefore, as illustrated in FIG. 4B, a gap between the dots in the sub scanning direction is half a gap between the dots in the main scanning direction. Needless to say, arrangement of the dots is not limited to the example illustrated in FIG. 4B.

Incidentally, high-speed printing may be realized simply by the high velocity v at which the head unit 20 travels in the main scanning direction. However, the high velocity v alone may result in a long distance D of the dots. Therefore, after a certain degree of resolution is secured, in order to realize the high-speed printing, it is necessary to increase the ink discharge frequency f and thus, to increase the number of dots formed per unit time.

In addition, apart from the printing speed, in order to increase the resolution, the number of dots formed per unit area may be increased. However, in a case of increasing the number of dots, adjacent dots are not only combined to each other when the ink is not discharged in a small amount, but also the printing speed is decreased when the ink discharge frequency f is not increased.

In this manner, in order to realize the high-speed printing and high-resolution printing, it is necessary to increase the ink discharge frequency f as described above.

Meanwhile, examples of the method of forming the dots on the printing medium P include a method (second method) in which the ink droplets can be discharged twice or more in a unit period, one or more ink droplets discharged in the unit period are caused to land, the one or more landing ink droplets are combined, and then, one dot is formed or a method (third method) in which the two or more ink droplets are not combined and two or more dots are formed, in addition to the method in which an ink droplet is discharged once and one dot is formed. In the following description, a case in which a dot is formed through the second method will be described.

In the present embodiment, the second method is described based on the following examples which are assumed. That is, according to the present embodiment, one dot is formed by discharging the ink twice at the maximum such that four tones of a large dot, a medium dot, a small dot, and non-recording are expressed. In order to express the four tones, two types of drive signals COM-A and COM-B are prepared in the present embodiment and each tone has a first half pattern and a second half pattern in one cycle. In the configuration, in one cycle, the drive signals COM-A and COM-B are selected (or not selected) in the first half and the second half in accordance with a tone to be expressed and are supplied to the piezoelectric element 60.

The drive signals COM-A and COM-B are described and then, a configuration of selecting the drive signals COM-A and COM-B is described. The drive signals COM-A and COM-B are generated by the drive circuits 50, respectively, and the drive circuits 50 will be described after the configuration of selecting the drive signals COM-A and COM-B for convenience.

FIG. 5 is a diagram illustrating waveforms of the drive signals COM-A and COM-B.

As illustrated in FIG. 5, the drive signal COM-A has a waveform formed by connecting a trapezoidal waveform Adp1 disposed in a period T1 from output (rising) of the control signal LAT to output of the control signal CH of a print cycle Ta with a trapezoidal waveform Adp2 disposed in a period T2 from the output of the control signal CH to the output of the next control signal LAT of the print cycle Ta.

The trapezoidal waveforms Adp1 and Adp2 according to the present embodiment are substantially the same waveforms and, when each of the waveforms is supplied to one end of a piezoelectric element 60, both waveforms cause a predetermined amount, specifically, a substantially medium amount of ink to be discharged from the nozzle 651 corresponding to the piezoelectric element 60.

The drive signal COM-B has a waveform formed by connecting a trapezoidal waveform Bdp1 disposed in the period T1 with a trapezoidal waveform Bdp2 disposed in the period T2. The trapezoidal waveforms Bdp1 and Bdp2 according to the present embodiment are different from each other. The trapezoidal waveform Bdp1 causes the ink in the vicinity of an opening of the nozzle 651 to minutely vibrate and prevents an increase in viscosity of the ink. Therefore, when the trapezoidal waveform Bdp1 is supplied to one end of the piezoelectric element 60, no ink droplet is discharged from the nozzle 651 corresponding to the piezoelectric element 60. In addition, the trapezoidal waveform Bdp2 is different from the trapezoidal waveform Adp1 (Adp2). When the trapezoidal waveform Bdp2 is supplied to one end of the piezoelectric element 60, a small amount of ink less than the predetermined amount is discharged from the nozzle 651 corresponding to the piezoelectric element 60.

Voltages at a start timing of the trapezoidal waveforms Adp1, Adp2, Bdp1, and Bdp2 and voltages at an end timing thereof are all common as a voltage Vc. In other words, the trapezoidal waveforms Adp1, Adp2, Bdp1, and Bdp2 are all started with the voltage Vc and are all ended with the voltage Vc.

FIG. 6 is a diagram illustrating a configuration of the selection controller 210 in FIG. 2.

As illustrated in FIG. 6, the clock signal Sck, the data signal Data, the control signals LAT and CH are supplied to the selection controller 210 from the control unit 10. The selection controller 210 includes a set of a shift register (S/R) 212 and a latch circuit 214, and a decoder 216 corresponding to each of the piezoelectric elements 60 (nozzles 651).

Here, when one dot of an image is formed by the data signal Data, the signal defines a size of the dot. In the present embodiment, in order to express four tones of non-recording, a small dot, a medium dot, and a large dot, the data signal Data is configured of 2 bits of the most significant bit (MSB) and the least significant bit (LSB).

The data signals Data are synchronized with the clock signal Sck and are serially supplied to each nozzle from the controller 100 along with main scanning of the head unit 20. The shift register 212 has a configuration for temporally hold the serially supplied data signals Data which are equivalent to 2 bits, corresponding to the nozzle.

To be more specific, the number of stages of the shift registers 212 corresponding to the number of piezoelectric elements 60 (nozzles) form a cascade connection with each other and the serially supplied data signals Data are transferred to a subsequent stage sequentially in accordance with the clock signal Sck.

When there are m (m is a plural number) piezoelectric elements 60, in order to distinguish the shift registers 212, the shift registers 212 are described as a first stage, a second stage, . . . , and an m-th stage sequentially from the upstream side from which the data signal Data is supplied.

The latch circuit 214 latches the data signal Data held in the shift register 212 at a rise of the control signal LAT.

The decoder 216 decodes the 2-bit data signal Data latched by the latch circuit 214 and outputs selection signals Sa and Sb for each of the periods T1 and T2 which are defined as the control signal LAT and the control signal CH such that selection in the selection section 230 is defined.

FIG. 7 is a diagram showing decoded details in the decoder 216.

In FIG. 7, latched 2-bit print data Data is described as (MSB and LSB). For example, the latched print data Data is (0,1), which means that the decoder 216 outputs logic levels of the selection signals Sa and Sb as H and L levels, respectively, in the period T1 and outputs as L and H levels, respectively, in the period T2.

The logic levels of the selection signals Sa and Sb are level-shifted by a level shifter (not illustrated) to higher amplitude logic than logic levels of the clock signal Sck, the print data Data, and the control signals LAT and CH.

Figure 8:
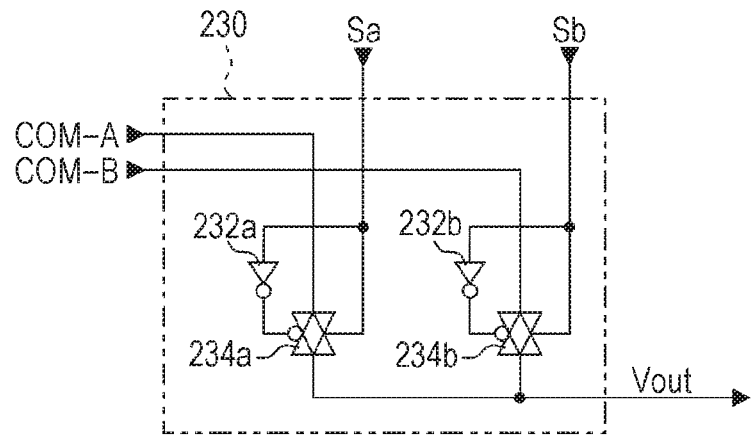
FIG. 8 is a diagram illustrating a configuration of a selection section in the head unit.

FIG. 8 is a diagram illustrating a configuration of the selection section 230 corresponding to one piezoelectric element 60 (nozzle 651) in FIG. 2.

As illustrated in FIG. 8, the selection section 230 includes inverters (NOT circuit) 232a and 232b and transfer gates 234a and 234b.

The selection signal Sa from the decoder 216 is supplied to a positive control end to which a circle is not attached in the transfer gate 234a and is subjected to logic inversion by the inverter 232a so as to be supplied to a negative control end to which a circle is not attached in the transfer gate 234a. Similarly, the selection signal Sb is supplied to a positive control end of the transfer gate 234b and is subjected to logic inversion by the inverter 232b so as to be supplied to a negative control end of the transfer gate 234b.

The drive signal COM-A is supplied to an input end of the transfer gate 234a and the drive signal COM-B is supplied to an input end of the transfer gate 234b. Output ends of the transfer gates 234a and 234b are commonly connected to each other and are connected to one end of the corresponding piezoelectric element 60.

When the selection signal Sa has the H level, the transfer gate 234a causes the input end and the output end to be conductive (on) to each other, and when the selection signal Sa has the L level, the transfer gate 234a causes the input end and the output end to be non-conductive (off) from each other. Similarly, the transfer gate 234b causes the input end and the output end to be on or off from each other in response to the selection signal Sb.

Next, operations of the selection controller 210 and the selection section 230 will be described with reference to FIG. 5.

The data signals Data are synchronized with the clock signals Sck and supplied serially to each of the nozzles from the controller 100 and transferred sequentially to the shift registers 212 corresponding to the nozzles. When the controller 100 stops the supply of the clock signal Sck, the data signal Data corresponding to the nozzle is in a state of being held in each of the shift registers 212. The data signal Data is supplied to the nozzles of the final m-th stage, . . . , the second stage, and the first stage in the shift registers 212 in a corresponding order.

Here, when the control signal LAT rises, the latch circuits 214 latch all the data signals Data held in the shift registers 212. In FIG. 5, L1, L2, . . . , Lm represent the data signals Data which are latched by the latch circuits 214 corresponding to the shift registers 212 of the first stage, the second stage, . . . , and the m-th stage.

The decoder 216 outputs the logic levels of the selection signals Sa and Sb as details illustrated in FIG. 7 in accordance with the size of the dot defined in latched data signal Data in each of the periods T1 and T2.

That is, first, in a case where the data signal Data is (1, 1) and the size of the large dot is defined, the decoder 216 outputs the selection signals Sa and Sb to be the H and L levels in the period T1, respectively, and to be H and L levels in the period T2, respectively. Second, in a case where the data signal Data is (0, 1) and the size of the medium dot is defined, the decoder 216 outputs the selection signals Sa and Sb to be the H and L levels in the period T1, respectively, and to be L and H levels in the period T2, respectively. Third, in a case where the data signal Data is (1, 0) and the size of the small dot is defined, the decoder 216 outputs the selection signals Sa and Sb to be the L and L levels in the period T1, respectively, and to be L and H levels in the period T2, respectively. Fourth, in a case where the data signal Data is (0, 0) and non-recording is defined, the decoder 216 outputs the selection signals Sa and Sb to be the L and H levels in the period T1, respectively, and to be L and L levels in the period T2, respectively.

Figure 9:
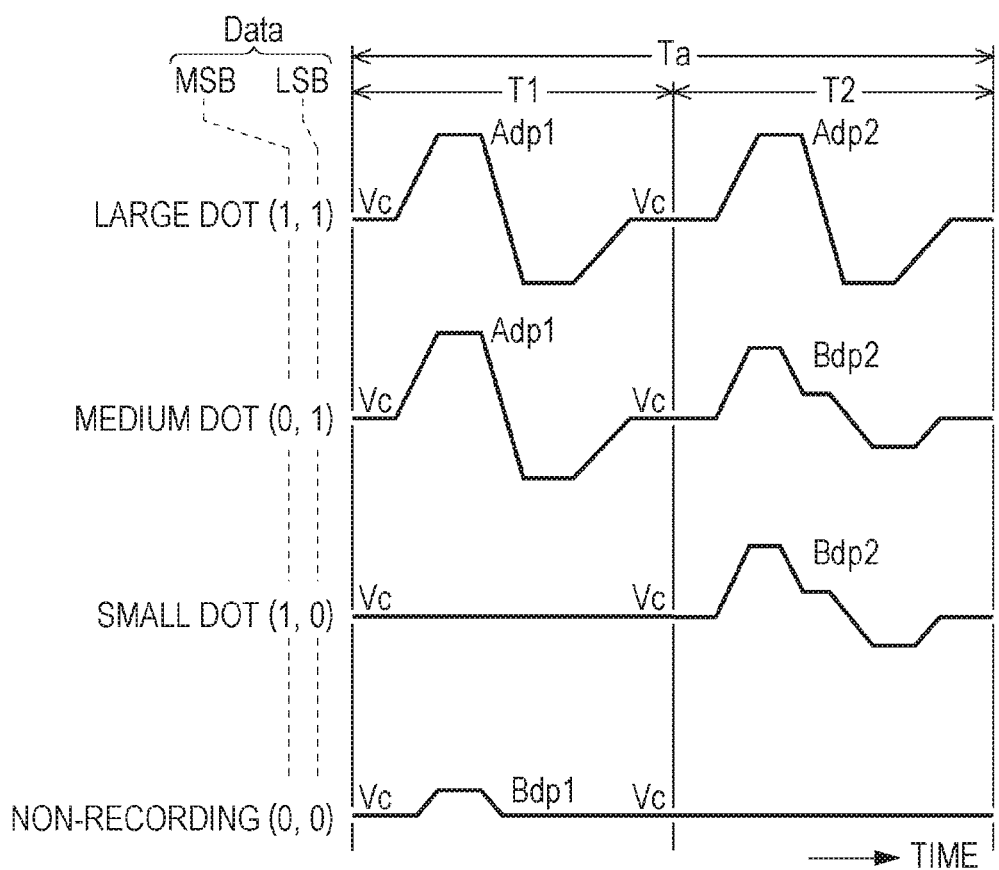
FIG. 9 is a diagram illustrating a drive signal that is selected by the selection section.

FIG. 9 is a diagram illustrating a voltage waveform of a drive signal that is selected in accordance with the data signal Data and is supplied to one end of the piezoelectric element 60.

When the data signal Data is (1, 1), the selection signals Sa and Sb have the H and L levels in the period T1, respectively. Therefore, the transfer gate 234a is turned on and the transfer gate 234b is turned off. Thus, the trapezoidal waveform Adp1 of the drive signal COM-A is selected in the period T1. Since the selection signals Sa and Sb have the H and L levels in the period T2, respectively, the selection section 230 selects the trapezoidal waveform Adp2 of the drive signal COM-A.

As above, the trapezoidal waveform Adp1 is selected in the period T1, the trapezoidal waveform Adp2 is selected in the period T2, and the waveforms are supplied to one end of the piezoelectric element 60 as the drive signal. Then, a substantially medium amount of ink is discharged twice from the nozzle 651 corresponding to the piezoelectric element 60. Therefore, the respective inks land and are combined on the printing medium P such that a large dot is formed as defined in the data signal Data.

When the data signal Data is (0, 1), the selection signals Sa and Sb have the H and L levels in the period T1, respectively. Accordingly, the transfer gate 234a is turned on and the transfer gate 234b is turned off. Therefore, the trapezoidal waveform Adp1 of the drive signal COM-A is selected in the period T1. Next, since the selection signals Sa and Sb have the L and H levels in the period T2, the trapezoidal waveform Bdp2 of the drive signal COM-B is selected.

Accordingly, a substantially medium amount of ink and a substantially small amount of ink are discharged twice from the nozzle. Therefore, the respective inks land and are combined on the printing medium P such that a medium dot as defined in the data signal Data is formed.

When the data signal Data is (1, 0), the selection signals Sa and Sb both have the L level in the period T1. Accordingly, the transfer gates 234a and 234b are turned off. Therefore, neither the trapezoidal waveforms Adp1 nor Bdp1 are selected in the period T1. In a case where the transfer gates 234a and 234b both are turned off, a path from a connection point between the output ends of the transfer gates 234a and 234b to one end of the piezoelectric element 60 has a high impedance state in which the path is not electrically connected to any portion. However, the piezoelectric element holds a voltage (Vc-$V_{BS}$) immediately before the transfer gates are turned off, by using capacity thereof.

Next, since the selection signals Sa and Sb have the L and H levels in the period T2, the trapezoidal waveform Bdp2 of the drive signal COM-B is selected. Therefore, since a substantially small amount of ink is discharged from the nozzle 651 in the period T2, a small dot as defined in the data signal Data is formed on the printing medium P.

When the data signal Data is (0, 0), the selection signals Sa and Sb have the L and H levels in the period T1, respectively. Accordingly, the transfer gate 234a is turned off and the transfer gate 234b is turned on. Therefore, the trapezoidal waveform Bdp1 of the drive signal COM-B is selected in the period T1. Next, since the selection signals Sa and Sb both have the L level in the period T2, neither the trapezoidal waveforms Adp2 nor Bdp2 is selected.

Therefore, the ink in the vicinity of an opening of the nozzle 651 minutely vibrates in the period T1 and the ink is not discharged. As a result, no dot is formed, that is, non-recording is performed as defined in the data signal Data.

As above, the selection section 230 selects (or does not select) the drive signals COM-A and COM-B in accordance with the instruction from the selection controller 210 and supplies the selected signals to one end of the piezoelectric element 60. Therefore, the piezoelectric element 60 is driven in accordance with the size of the dot defined in the data signal Data.

The drive signals COM-A and COM-B illustrated in FIG. 5 are only examples. Practically, a combination of various waveforms prepared in advance is used depending on the traveling speed of the head unit 20, properties of the printing medium P, or the like.

In addition, an example in which the piezoelectric element 60 is bent upwardly in response to an increase of the voltage is described, but when the voltage to be supplied to the electrodes 611 and 612 is inverted, the piezoelectric element 60 is bent downwardly in response to the increase of the voltage. Therefore, in a configuration in which the piezoelectric element 60 is bent downwardly in response to the increase of the voltage, the drive signals COM-A and COM-B illustrated in FIG. 5 have waveforms inverted with the voltage Vc as a reference.

In this manner, according to the present embodiment, one dot is formed on the printing medium P with the cycle Ta which is the unit period as a unit. Therefore, in the present embodiment in which one dot is formed by discharging ink droplets twice (at the maximum) in the cycle Ta, the ink discharge frequency f becomes 2/Ta and the dot distance D is represented by a value obtained by dividing the traveling velocity v of the head unit by an ink discharge frequency f (=2/Ta).

In general, the ink droplets can be discharged Q (Q is an integer of 2 or higher) times in the unit period T and it is possible for the ink discharge frequency f to be represented by Q/T in a case where the ink droplets are discharged Q times such that one dot is formed.

As in the present embodiment, in a case where different sizes of dots are formed on the printing medium P, it is necessary to shorten time taken for discharging one ink droplet once even when time (cycle) taken to form one dot is the same, compared to a case in which one ink droplet is discharged once and one dot is formed.

There is no need to provide a particular description of the third method in which two or more dots are formed without combination of two or more ink droplets.

Next, the drive circuits 50-a and 50-b will be described. The outline of one drive circuit 50-a is that the drive signal COM-A is generated as follows. That is, the drive circuit 50-a, first, performs analog conversion of the data dA supplied from the controller 100, second, returns the output drive signal COM-A, corrects a difference between a signal (damping signal) based on the drive signal COM-A and a target signal by a high-frequency component of the drive signal COM-A, generates a modulated signal in accordance with the corrected signal, third, generates an amplified modulated signal through switching the transistors in accordance with the modulated signal, fourth, smoothes (demodulates) the amplified modulated signal using a low-pass filter, and outputs the smoothed signal as the drive signal COM-A.

Figure 10:
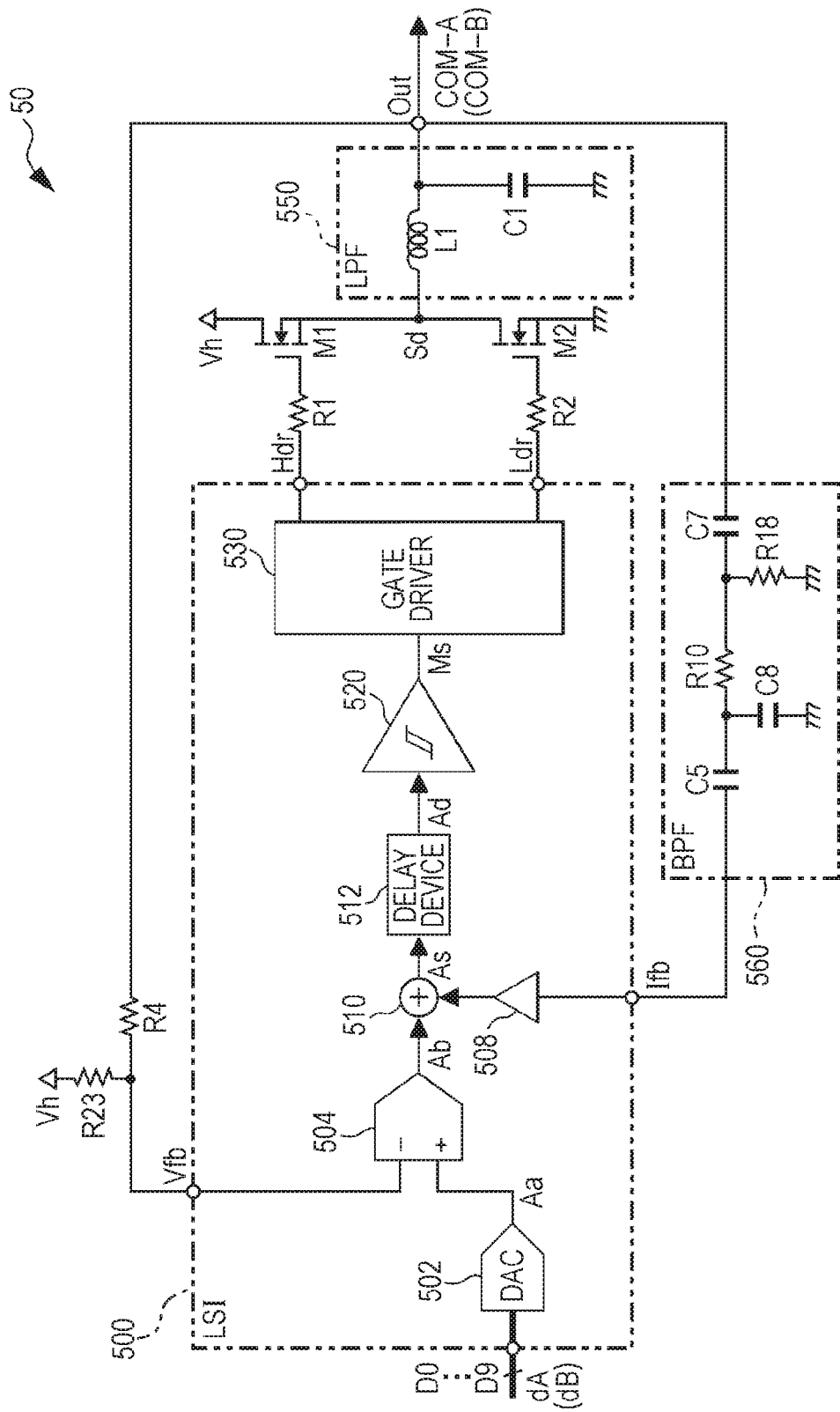
FIG. 10 is a diagram illustrating a configuration of a drive circuit in the printing apparatus.

The other drive circuit 50-b has the same configuration and is different only in that the drive signal COM-B is output from the data dB. In FIG. 10 to be described below, the drive circuits 50-a and 50-b are not distinguished and are described as the drive circuit 50.

However, the data to be input or the drive signal to be output is described as dA (dB) and COM-A (COM-B), which means that, in a case of the drive circuit 50-a, the data dA is input and the drive signal COM-A is output and, in a case of the drive circuit 50-b, the data dB is input and the drive signal COM-B is output.

FIG. 10 is a diagram illustrating a circuit configuration of the drive circuit 50.

As illustrated in FIG. 10, the drive circuit 50 is configured to include various elements such as a resistor or a capacitor, in addition to an LSI 500 and N-channel type transistors M1 and M2.

The large scale integration (LSI) 500 outputs a gate signal to, for example, each of the field effect transistors (FET) M1 and M2 based on 10-bit data dA (dB) which is input through pins D0 to D9 from the controller 100. Since the LSI 500 outputs such a gate signal, the LSI 500 includes a digital to analog converter (DAC) 502, adders 504 and 510, an attenuator 508, a delay device 512, a comparator 520, and a gate driver 530.

The DAC 502 converts the data dA (dB) that defines the waveform of the drive signal COM-A (COM-B) into an analog signal Aa and supplies the analog signal Aa to an input end (+) of the adder 504. A voltage amplitude of the analog signal Aa is substantially, for example, 0 volts to 2 volts. When the voltage is amplified substantially by 20 times, the drive signal COM-A (COM-B) is obtained. That is, the analog signal Aa is a target of the drive signal COM-A before amplification.

A voltage of a terminal Out which is input through a pin Vfb, that is, the drive signal COM-A (COM-B) is supplied to an input end (−) of the adder 504.

The adder 504 integrates/attenuates the voltage of the input end (−) and calculates a voltage of the input end (+). To be more specific, the adder 504 calculates a difference obtained by subtracting the integrated/attenuated voltage of the input end (−) from the voltage of the input end (+) and supplies a signal Ab representing the difference to one input end of the adder 510.

A power-supply voltage of a circuit from the DAC 502 to the comparator 520 is 3.3 volts in a low amplitude. The voltage of the analog signal Aa is about 2 volts at the most. In contrast, since the voltage of the drive signal COM-A exceeds 40 volts at the most in some cases, the voltage of the drive signal COM-A (COM-B) is attenuated so as to match an amplitude range of both of the voltages when calculating a difference.

The attenuator 508 attenuates the high-frequency component of the drive signal COM-A (COM-B) input through the pin Ifb and supplies the attenuated signal to the other input end of the adder 510. Similar to the input end (−) in the adder 504, the attenuation by the attenuator 508 is performed so as to match the voltage amplitude in returning of the drive signal COM-A (COM-B). The adder 510 supplies the signal As of the voltage obtained by adding the voltage of one input end to the voltage of the other input end, to the delay device 512.

The voltage of the signal As which is output from the adder 510 is obtained by adding an attenuation voltage of a signal supplied to the pin Ifb to the difference obtained by subtracting an attenuation voltage of a signal supplied to the pin Vfb from the voltage of the analog signal Aa representing the target. Therefore, the voltage of the signal As by the adder 510 can be referred to as a signal obtained by correcting the difference obtained by subtracting the attenuation voltage of the drive signal COM-A (COM-B) which is output from the voltage of the analog signal Aa which is the target, by the high-frequency component of the drive signal COM-A (COM-B).

The delay device 512 supplies a signal Ad which is delayed by a time to be described below from the signal As, to the comparator 520.

The comparator 520 outputs a modulated signal Ms which is subjected to pulse modulation as follows, based on the signal Ad which is caused to be delayed by the delay device 512. To be more specific, the comparator 520 outputs the modulated signal Ms which has the H level when the voltage thereof becomes a voltage threshold value Vth1 or more at the time of a voltage increase of the signal Ad and which has the L level when the voltage thereof is lower than the voltage threshold value Vth2 at the time of a voltage drop of the signal Ad. As will be described below, the voltage threshold value is set to have a relationship of Vth1>Vth2.

The modulated signal Ms by the comparator 520 is supplied to the gate driver 530. The gate driver 530 converts the modulated signal Ms to have a high-logic amplitude and supplies the converted voltage to a gate electrode of the transistor M1 through a pin Hdr and a resistor R1. In addition, the comparator 520 converts a signal obtained by inverting the logic level of the modulated signal Ms to have the high-logic amplitude and supplies the converted voltage to the gate electrode of the transistor M2 through a pin Ldr and a resistor R2.

Therefore, the logic levels of the gate signals supplied to the gate electrodes of the transistors M1 and M2 are mutually incompatible.

Practically, the logic levels of the two gate signals output by the gate driver 530 may be subjected to timing control such that both logic levels do not become the H level concurrently (that is, such that the N-channel type transistors M1 and M2 are not concurrently turned on). Here, to be incompatible means that, to be more exact, both logic levels concurrently do not become the H level (the transistors M1 and M2 are not concurrently turned on).

Incidentally, the modulated signal means the modulated signal Ms in a more limited sense; however, when it is considered that the modulated signal is subjected to the pulse modulation in accordance with the signal Aa and drives the transistors M1 and M2, the gate signal to the transistor M1 and the gate signal to the transistor M2 are also included in the modulated signal. In other words, the modulated signal subjected to the pulse modulation in accordance with the signal Aa includes not only the modulated signal Ms but also a signal subjected to inverting the logic level of the modulated signal Ms or a signal subjected to the timing control.

Since the comparator 520 outputs the modulated signal Ms, a circuit to the comparator 520, that is, a circuit from the DAC 502 through the adders 504 and 510, the attenuator 508, and the delay device 512, to the comparator 520 can be referred to as a modulation circuit which generates the modulated signal Ms.

In addition, in the configuration illustrated in FIG. 10, the digital data dA (dB) is converted into the analog signal Aa by the DAC 502; however, the signal Aa may be supplied from an external circuit, for example, in response to an instruction from the controller 100 without the DAC 502. Since the digital data dA (dB) and the analog signal Aa define a target value when the waveform of the drive signal COM-A (COM-B) is generated, both the digital data dA (dB) and the analog signal Aa are invariably the source signals.

A voltage Vh (for example, 42 volts) is applied to a drain electrode in the high-side transistor M1 of the transistors M1 and M2. A source electrode in the low-side transistor M2 is grounded to a ground.

Since each of the transistors M1 and M2 is, for example, N-channel type, the transistors M1 and M2 are turned on when the gate signal has the H level. Therefore, the amplified modulated signal generated by amplifying the modulated signal Ms exists at a connection point Sd between the source electrode of the transistor M1 and the drain electrode of the transistor M2, that is, at one end of the inductor L1. Therefore, the transistors M1 and M2 as a pair of transistors output the amplified modulated signal generated by amplifying the modulated signal Ms.

The other end of the inductor L1 is the terminal Out which becomes the output in the drive circuit 50 and the drive signal COM-A (COM-B) is supplied to the head unit 20 from the terminal Out through the flexible cable 190 (refer to FIG. 1 and FIG. 2).

In addition, the terminal Out is connected to each of one end of a capacitor C1, one end of a capacitor C7, and one end of a resistor R4. The other end of the capacitor C1 is grounded to the ground. Therefore, the inductor L1 and the capacitor C1 function as a low-pass filter (LPF) 550 which smoothes the amplified modulated signal existing at the connection point of the transistors M1 and M2.

The other end of the resistor R4 is connected to the pin Vfb and one end of a resistor R23 and the voltage Vh is applied to the other end of the resistor R23. Accordingly, at the pin Vfb, the drive signal COM-A (COM-B) from the terminal Out is pulled up and is returned.

The resistors R4 and R23 are positioned outside the LSI 500; however, the resistors may be positioned inside the LSI 500.

The other end of the capacitor C7 is connected to one end of a resistor R18 and one end of a resistor R10. The other end of the resistor R18 is grounded to the ground. Therefore, the capacitor C7 and the resistor R18 function as a high-pass filter (HPF) which allows a high-frequency component having a frequency higher than a cutoff frequency to pass through, of the drive signal COM-A (COM-B) from the terminal Out. The cutoff frequency of the HPF is set to, for example, substantially 9 MHz.

In addition, the other end of the resistor R10 is connected to one end of a capacitor C5 and one end of a capacitor C8. The other end of the capacitor C8 is grounded to the ground. Therefore, the resistor R10 and the capacitor C8 function as the LPF which allows a low-frequency component having a frequency lower than the cutoff frequency to pass through, of the signal components which passed through the HPF. The cutoff frequency of the LPF is set to, for example, substantially 160 MHz.

Since the cutoff frequency of the HPF is set to be lower than the cutoff frequency of the LPF, the HPF and the LPF function as a band pass filter (BPF) 560 which allows a frequency component in a predetermined frequency range to pass through, of the drive signal COM-A (COM-B).

The other end of the capacitor C5 is connected to the pin Ifb of the LSI 500. Accordingly, of the high-frequency component of the drive signal COM-A (COM-B) which passed through the BPF, a DC component is cut and is returned at the pin Ifb.

The drive circuit 50 has, as a feedback path, two paths, that is, a path through the pin Vfb and a path through the pin Ifb. A dominant path which defines a frequency of self-oscillation is the path through the pin Ifb. Therefore, a feedback circuit means a circuit related to the path through the pin Ifb and, specifically, means the LPF 550 and the BPF 560.

The drive signal COM-A (COM-B) output from the terminal Out is generated by smoothing the amplified modulated signal at the connection point Sd of the transistors M1 and M2 by the LPF 550. The drive signal COM-A (COM-B) is returned to the adder 504 through the pin Vfb and is output as the signal Aa which is the target and the signal Ab which is the difference.

Here, for convenience of description, when a configuration in which returning though the pin Ifb and delay by the delay device 512 are ruled out is assumed, the modulated signal Ms is subjected to the self-oscillation at a frequency determined by a transfer function of the feedback path, that is, the path through the LPF 550 and the adder 504 because the drive signal COM-A (COM-B) is integrated/attenuated through the pin Vfb and is returned to the adder 504.

However, since an amount of delay in the feedback path through the pin Vfb is great, it is not possible to increase the frequency of the self-oscillation only by the returning through the pin Vfb so as to secure sufficient accuracy of the waveform of the drive signal COM-A (COM-B).

In the present embodiment, a path of returning the high-frequency component of the drive signal COM-A (COM-B) through the pin Ifb is provided in addition to the path through the pin Vfb and thereby, delay is decreased when the entire circuit is considered. Therefore, the frequency of the signal As which is obtained by adding the high-frequency component of the drive signal COM-A (COM-B) to the signal Ab is increased (that is, the frequency of the self-oscillation is increased) compared to a case where the path through the pin Ifb does not exist and ripple components in the drive signal COM-A (COM-B) are decreased and the accuracy of the waveform is increased.

An amount of the delay in the delay device 512 will be described below.

Figure 11:
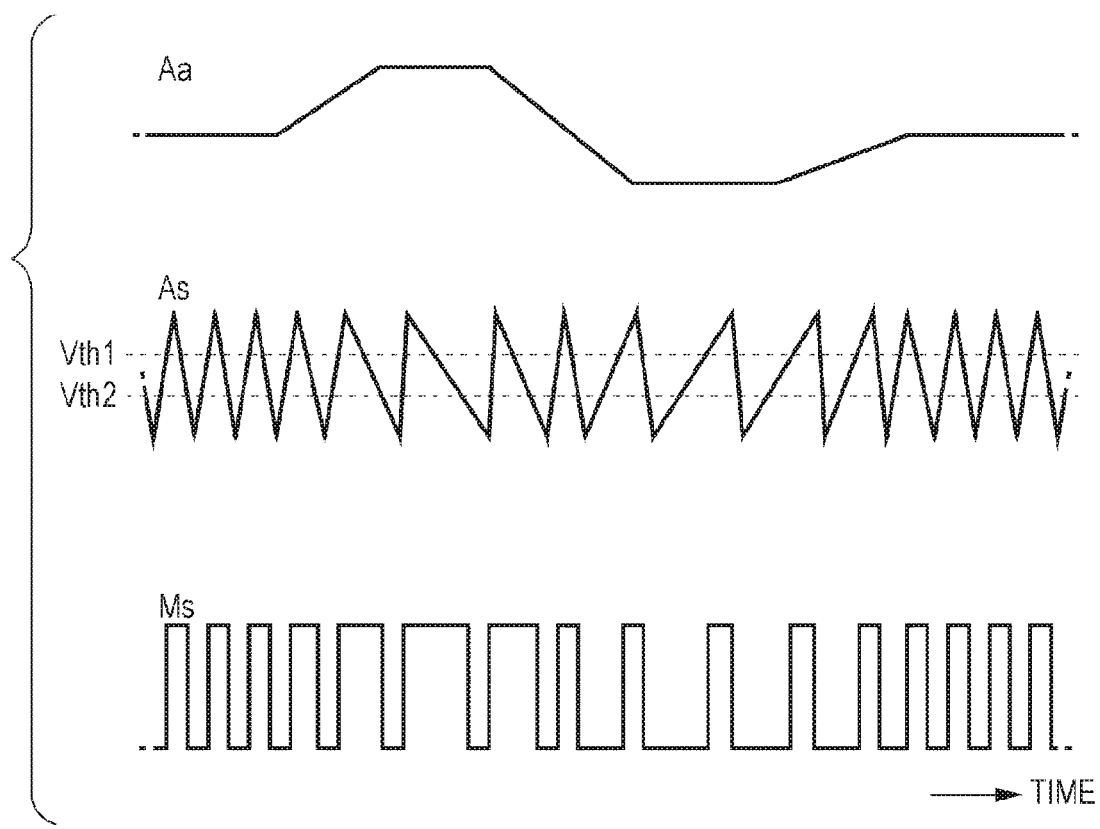
FIG. 11 is an explanatory diagram of an operation of the drive circuit.

FIG. 11 is a diagram illustrating an ideal relationship between the signal As and the modulated signal Ms with respect to the waveform of the analog signal Aa.

As illustrated in FIG. 11, the signal As is a triangular wave and an oscillation frequency thereof varies depending on a voltage (input voltage) of the analog signal Aa. Specifically, the oscillation frequency is most increased in a case where the input voltage is an intermediate value and the oscillation frequency is decreased when the input voltage is increased or decreased from the intermediate value. The signal As (Ad) is a self-oscillation signal.

In addition, a slope of the triangle in the signal As is substantially equal to rising (increase of the voltage) and drop (decrease of the voltage) when the input voltage approaches the intermediate value. Therefore, a duty ratio of the modulated signal Ms becomes substantially 50% as a result obtained by comparing the signal As with the voltage threshold values Vth1 and Vth2 by the comparator 520. When the input voltage is higher than the intermediate value, the downward slope of the signal As becomes gentle. Therefore, a period in which the modulated signal Ms has the H level becomes relatively longer and the duty ratio becomes greater. Meanwhile, when the input voltage value becomes smaller than the intermediate value, the upward slope of the signal As becomes gentle. Therefore, a period in which the modulated signal Ms has the L level becomes relatively shorter and the duty ratio becomes small.

Therefore, the modulated signal Ms becomes a pulse density modulation signal as follows. That is, the duty ratio of the modulated signal Ms is substantially 50% when the input voltage is the intermediate value, the duty ratio becomes greater when the input voltage becomes greater than the intermediate value, and the duty ratio is decreased when the input voltage value becomes smaller than the intermediate value.

As described above, the gate driver 530 turns on/off the transistors M1 and M2 based on the modulated signal Ms. That is, the gate driver 530 turns on the transistor M1 and turns off the transistor M2 when the modulated signal Ms has the H level and the gate driver 530 turns off the transistor M1 and turns on the transistor M2 when the modulated signal Ms has the L level.

Accordingly, the voltage of the drive signal COM-A (COM-B) generated by smoothing the amplified modulated signal at the connection point Sd of the transistors M1 and M2 by the inductor L1 and the capacitor C1 is increased when the duty ratio of the modulated signal Ms becomes greater and the voltage is decreased when the duty ratio becomes smaller. As a result, the drive signal COM-A (COM-B) is controlled so as to become a signal which is subjected to an increase of the voltage of the analog signal Aa and is output.

Since the drive circuit 50 uses the pulse density modulation, it is advantageous that a range of change of the duty ratio can be greater compared to a pulse width modulation in which the modulation frequency is fixed.

That is, since the minimum positive pulse width and negative pulse width which can be handled in the entire circuit are restrained by the circuit properties thereof, only a predetermined range (for example, a range of 10% to 90%) can be secured as a range of change of the duty ratio in the pulse width modulation of the fixed frequency. In contrast, since the oscillation frequency is decreased in the pulse density modulation when a gap between the input voltage and the intermediate value becomes greater, the duty ratio can become greater in a region in which the input voltage is high and the duty ratio can become low in a region where the input voltage is low. Therefore, in the self-oscillation type pulse density modulation, a broader range (for example, a range of 5% to 95%) can be secured as the range of change of the duty ratio.

In addition, in the drive circuit 50, the self-oscillation is performed and thus a circuit that generates a carrier wave having a high frequency as in a separately-excited oscillation is not required. Therefore, it is advantageous that it is easy to integrate circuits other than circuits having a high voltage, that is, of functions taken by the LSI 500.

However, in an actual drive circuit 50, there is a problem in that the stability of the self-oscillation is poor.

Figure 12A:
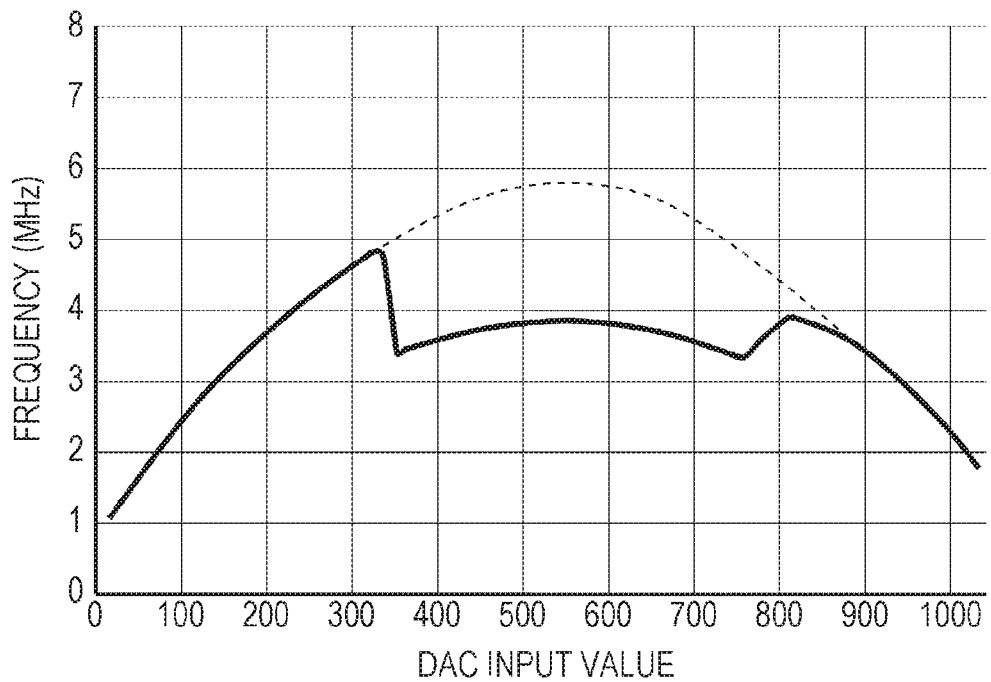
FIGS. 12A and 12B are diagrams illustrating a frequency characteristic of self-oscillation in the drive circuit.
Figure 12B:
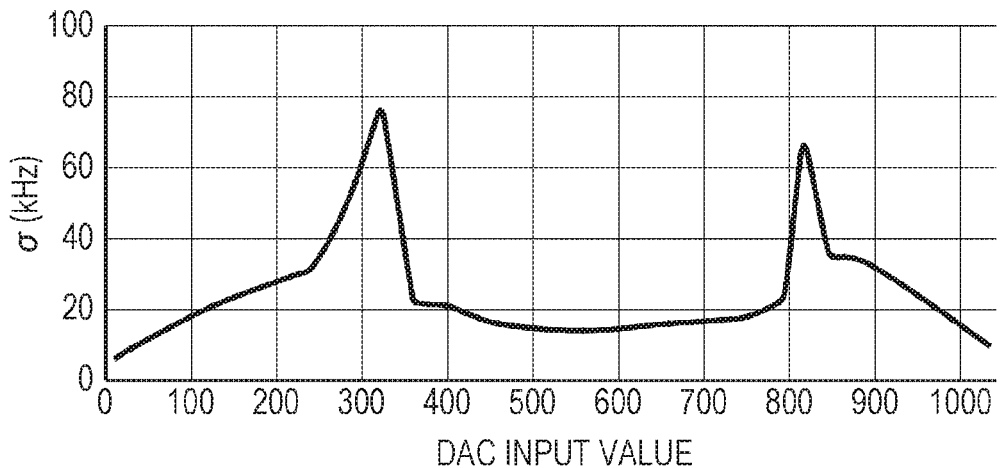

FIGS. 12A and 12B are diagrams illustrating a frequency stability of the self-oscillation. FIG. 12A is a diagram illustrating an example of a frequency characteristic of the self-oscillation with respect to an input value of the DAC 502 and FIG. 12B is a diagram illustrating an example of frequency dispersion (variation) of the self-oscillation with respect to the input value. The input value of the DAC 502 in FIGS. 12A and 12B is described as a decimal of 10-bits data dA (dB).

As illustrated in FIG. 11, it is ideal that the frequency of the self-oscillation becomes highest when the voltage of the signal Aa becomes the intermediate value, that is, in the vicinity of "500" when the input value of the data dA (dB) is described in decimal and the frequency becomes lower when the gap between the input voltage and the intermediate value becomes greater. However, practically, as illustrated in FIG. 12A, the frequency of the self-oscillation is dropped in a range in which the intermediate value is included.

In addition, as illustrated in FIG. 12B, the frequency dispersion has a peak point around a boundary at which the frequency drops. That is, the frequency of the self-oscillation in the vicinity thereof has variation and no sufficient stability is achieved.

Next, a reason why the frequency of the self-oscillation is not stable will be checked.

Figure 13:
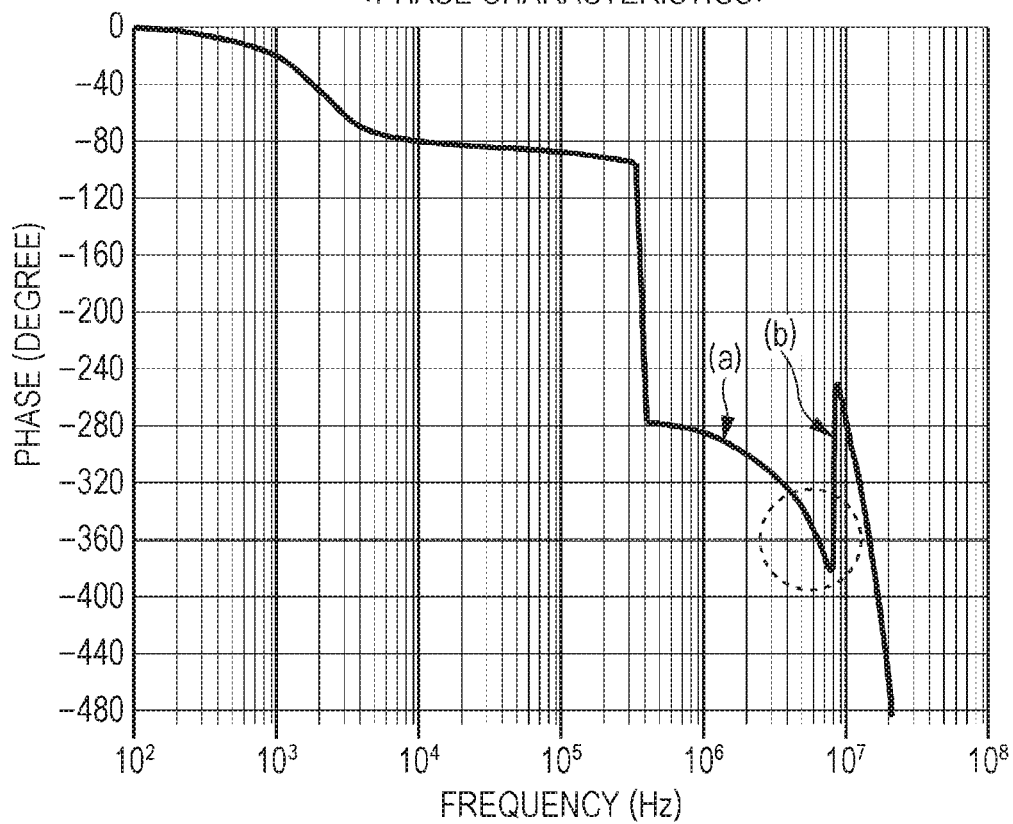
FIG. 13 is a diagram illustrating a phase difference characteristic in the drive circuit.

FIG. 13 is a diagram illustrating characteristics of a difference (phase difference) between a phase of the modulated signal Ms and a phase of the signal Ad which causes the amplified modulated signal generated by driving the transistors M1 and M2 based on the modulated signal Ms to be returned through the LPF 550 and the BPF 560. Here, the amount of delay in the delay device 512 is set to be zero for the sake of description.

As illustrated with a dashed-line circle in FIG. 13, a phase difference has the minimum point when the frequency of the self-oscillation is about 6 MHz to 8 MHz. Further, the phase difference in the minimum point becomes a value around −360 degrees after a delay of one cycle.

What is understood from the characteristics is that two frequencies which have the phase differences around −360 degrees approach each other and, to be more specific, the phase difference is inclined to any side of (a) side of the low-frequency side or (b) side of the high-frequency side with respect to the minimum point when the frequency of the self-oscillation of is around 6 MHz to 8 MHz and it is difficult to determine one of the two states.

Accordingly, in order to stabilize the frequency of the self-oscillation, two frequencies having the phase differences around −360 degrees may not approach the frequency region used in the self-oscillation.

Figure 14:
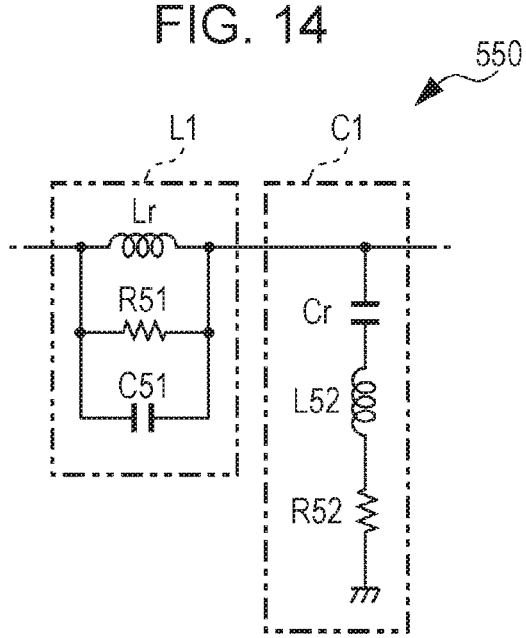
FIG. 14 is a diagram illustrating an equivalent circuit of an LPF in the drive circuit.

FIG. 14 is a diagram illustrating an equivalent circuit of the LPF 550.

Not only an original inductance Lr, but also resistor R51 in the electrode or in the winding wire or capacitance C51 in a portion formed by winding wires parasitize in the inductor L1 that configures the LPF 550. Not only an original inductance Cr, but also a resistor R52 in the electrode or the like or an inductance L52 parasitize even in the capacitor C1 that configures the LPF 550.

Figure 15:
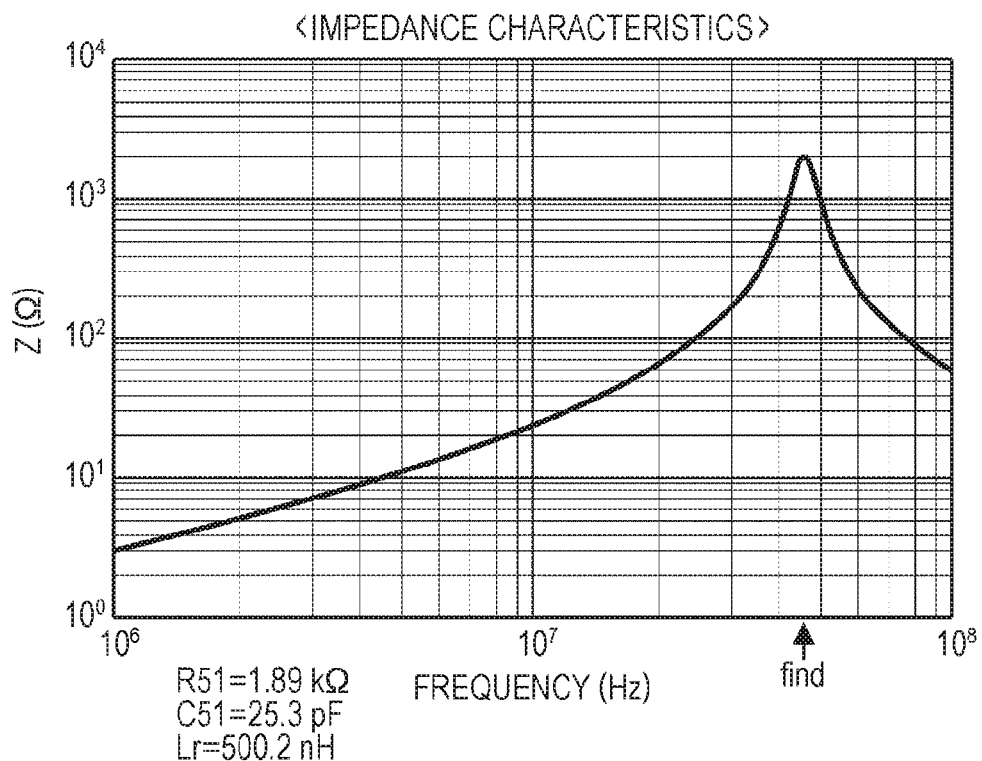
FIG. 15 is a diagram illustrating an impedance characteristic of an inductor of the LPF.

FIG. 15 is a diagram illustrating an impedance characteristic of the inductor L1.

An inductance Z of the inductor L1 becomes greater when the frequency is increased and the original inductance Lr and the capacitance C51 cause a resonant phenomenon in a certain frequency f ind. Further, when the frequency is increased, the capacitance C51 becomes dominant and the impedance Z becomes low.

In the characteristics of such an impedance Z, the frequency f ind that has an inflection (maximum) point is referred to as an inductor self-resonant frequency. At the frequency which is higher than the self-resonant frequency f ind, the inductor does not function as the inductor.

Figure 16:
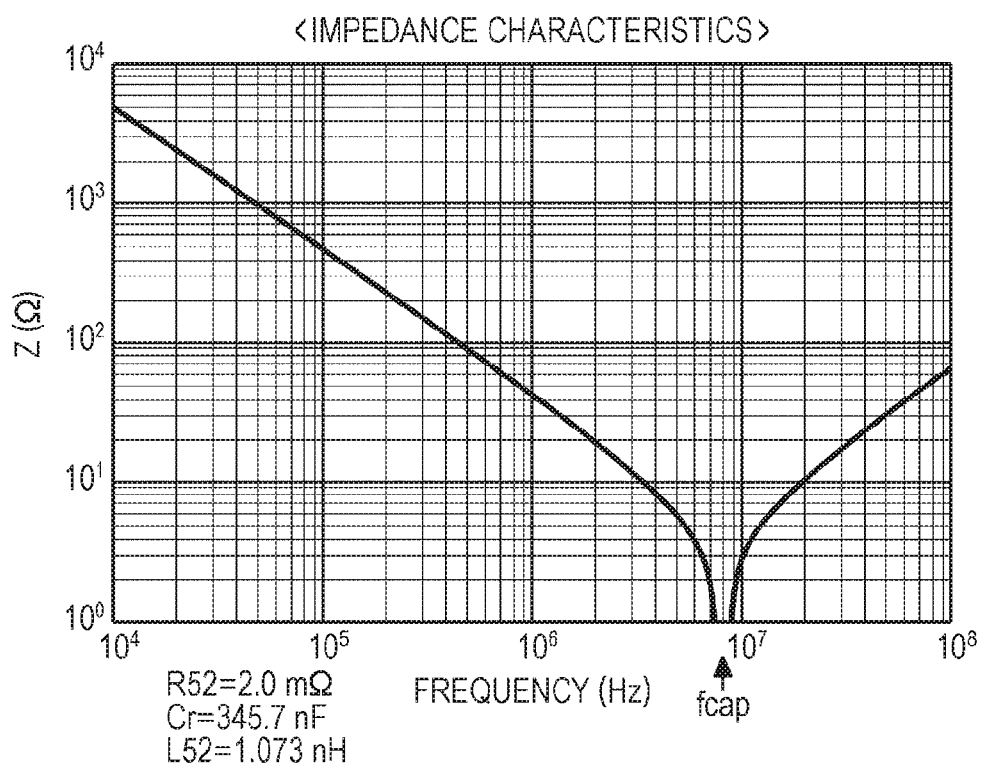
FIG. 16 is a diagram illustrating an impedance characteristic of a capacitor of the LPF.

FIG. 16 is a diagram illustrating an impedance characteristic of the capacitor c1 actually.

The impedance Z of the capacitor C1 becomes lower when the frequency becomes higher. At a certain frequency f cap, the original inductance Cr and the inductance L52 cause the resonant phenomenon. Further, when the frequency becomes high, the inductance L52 becomes dominant, and the inductance Z becomes high.

In the characteristics of the impedance Z, the frequency f cap forming the inflection (minimum) point is referred to as the self-resonant frequency of the capacitor. At a frequency higher than the self-resonant frequency f cap, the capacitor does not function as the capacitor.

The following points are carefully described. That is, the frequency at the minimum point in FIG. 13 is not affected by the self-oscillation frequency f ind of the inductor L1 in FIG. 15 and at the point, the frequency is substantially equal to the frequency of the self-resonant frequency f cap of the capacitor C1 in FIG. 16. That is, in FIG. 13, one factor of determining the frequency at the minimum point of the phase difference characteristics, that is, the frequency at which the self-oscillation is likely to be stable is the self-resonant frequency f cap of the capacitor C1, and the self-resonant frequency fl of the inductor L1 does not influence the frequency fm of the self-oscillation. Accordingly, when the self-resonant frequency f cap of the capacitor C1 is more increased than the frequency fm (the maximum value) of the self-oscillation, $$f\text{cap} > fm \tag{1}$$

such that the frequency of the self-oscillation is likely to become stable.

When the frequency fm of the self-oscillation approaches the self-resonant frequency f cap, the self-oscillation becomes unstable in some cases, $$f\text{cap} \geq 1.5 fm \tag{2}$$

that is, it is preferable that the self-resonant frequency f cap of the capacitor C1 is increased by 1.5 times the frequency fm of the self-oscillation.

Figure 17:
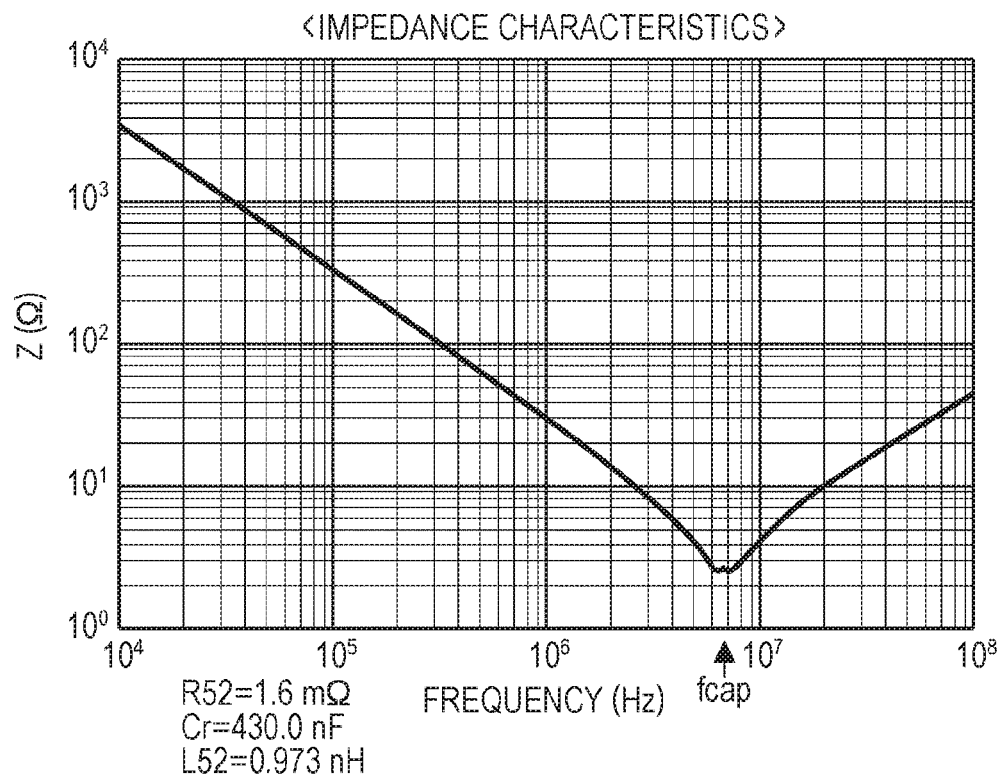
FIG. 17 is a diagram illustrating an impedance characteristic of a capacitor of the LPF.

When the capacitance Cr of the capacitor C1 is increased, the impedance characteristics of the capacitor C1 becomes as illustrated in FIG. 17, and the self-resonant frequency f cap is decreased. In contrast, it is said that the self-resonant frequency f cap of the capacitor C1 becomes greater and it is effective that the capacitance Cr is decreased.

Figure 18A:
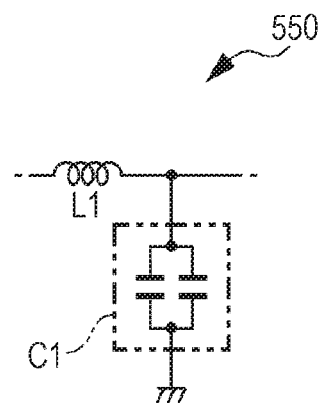
FIGS. 18A and 18B are diagrams illustrating an example of connection of the capacitor in the LPF.
Figure 18B:
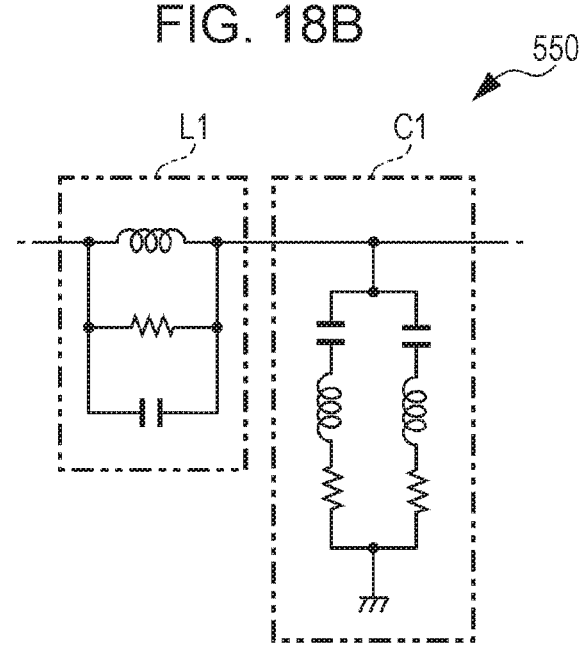

In addition, when the capacitance of the capacitor becomes smaller, it is expected that a parasitic inductance becomes small because all of the elements are decreased in size including the electrode or the like. However, it is not possible to secure a predetermined capacitance as is. For example, as illustrated in FIGS. 18A and 18B, two capacitor elements that have a predetermined value of capacitance are connected in parallel to each other and it is preferable that the total capacity is used as the capacitor C1.

According to the configuration of such a parallel connection, the parasitic inductance becomes small, and the self-resonant frequency is increased when the capacitor C1 is considered. The number of elements of the capacitors connected in parallel is not limited "2" and "3" or more elements may be used.

In the present embodiment, as described above, the delay is decreased when the entire circuit is considered by the path through which the high-frequency component of the drive signal COM-A (COM-B) is returned through the pin Ifb in addition to the path through the pin Vfb, and the frequency of the self-oscillation is increased. In contrast, the amount of delay at this time is set to be appropriate, and thereby, the conditions of the above inequality expression (1) or (2) are satisfied and it is possible to increase the stability of the self-oscillation.

Here, in FIG. 10, the path of returning the high-frequency component of the drive signal COM-A (COM-B) is from the connection point Sd through the LPF 550, the BPF 560, the attenuator 508, the adder 510, the delay device 512, the comparator 520, the gate driver 530, the resistors R1 and R2, and the transistors M1 and M2 to the connection point Sd. It is possible to relatively easily set the amount of the delay in the LPF 550, the BPF 560, and the delay device 512.

That is, it is possible to set the amount of the delay by the cutoff frequency in the LPF 550. Similarly, since both the HPF and the LPF function as the BPF 560, it is possible to set the amount of the delay by the cutoff frequency in the BPF 560 as described above. A detailed configuration of the delay device 512 is not described, and for example, similarly, it is possible to set the amount of the delay by the cutoff frequency as the LPF of, for example, the digital film. In addition, in the delay device 512, the amount of delay may be set by a configuration of simply switching the number of cascade connections of the logic circuit (NOT circuit).

In addition, it is possible to hold a delay element by adding, for example, an integration circuit in the attenuator 508 and it is possible to hold a delay element by, for example, the voltage threshold values Vth1 and Vth2 in the comparator 520. A delay element may be held in the gate driver 530 when the logic amplitude is changed. A delay element is held in the transistors M1 and M2 at the time of switching on and off. Further, the resistor R1 (R2) of a gate of the transistor M1 (M2) or a capacity component which is parasitized in the gate can become a delay element.

In this manner, when at least one delay element is held in the circuit which is present in the above feedback path, the amount of delay is appropriately set and the frequency fm of the self-oscillation may be decreased. That is, when the amount of delay in the feedback path becomes longer, the frequency fm of the self-oscillation is decreased. Therefore, the frequency fm is decreased to be lower than the self-resonant frequency f cap of the capacitor C1 and thereby, it is possible to stabilize the self-oscillation.

Incidentally, the drive circuit 50 is configured to include various elements such as an LSI, a capacitor, and a resistor which are mounted on the circuit board. Next, the circuit board, an arrangement, and a mounting method of the elements which configure the drive circuit 50 will be described.

Figure 19:
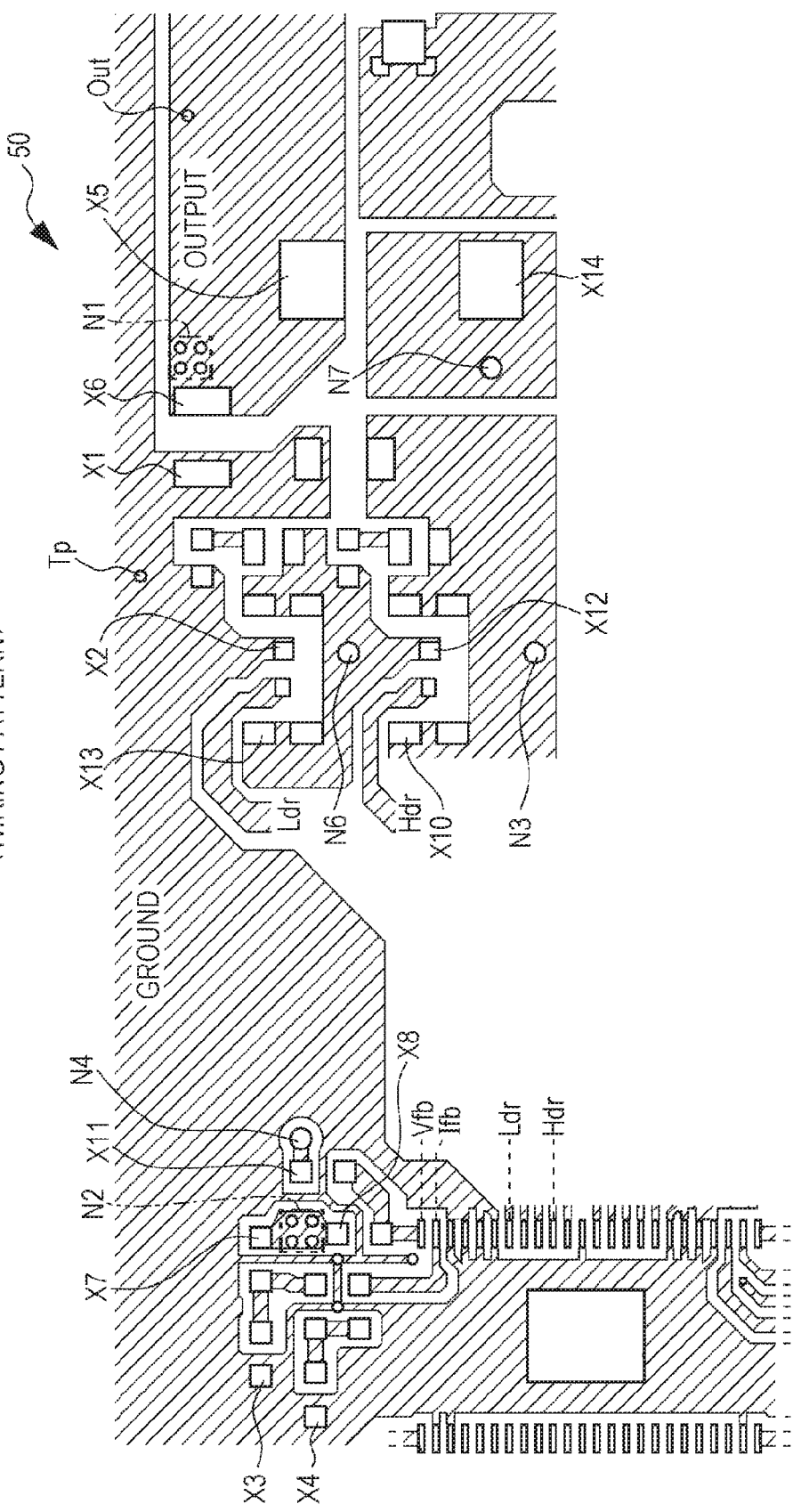
FIG. 19 is a plan view illustrating a wiring pattern of a circuit board on which the drive circuit is mounted.
Figure 20:
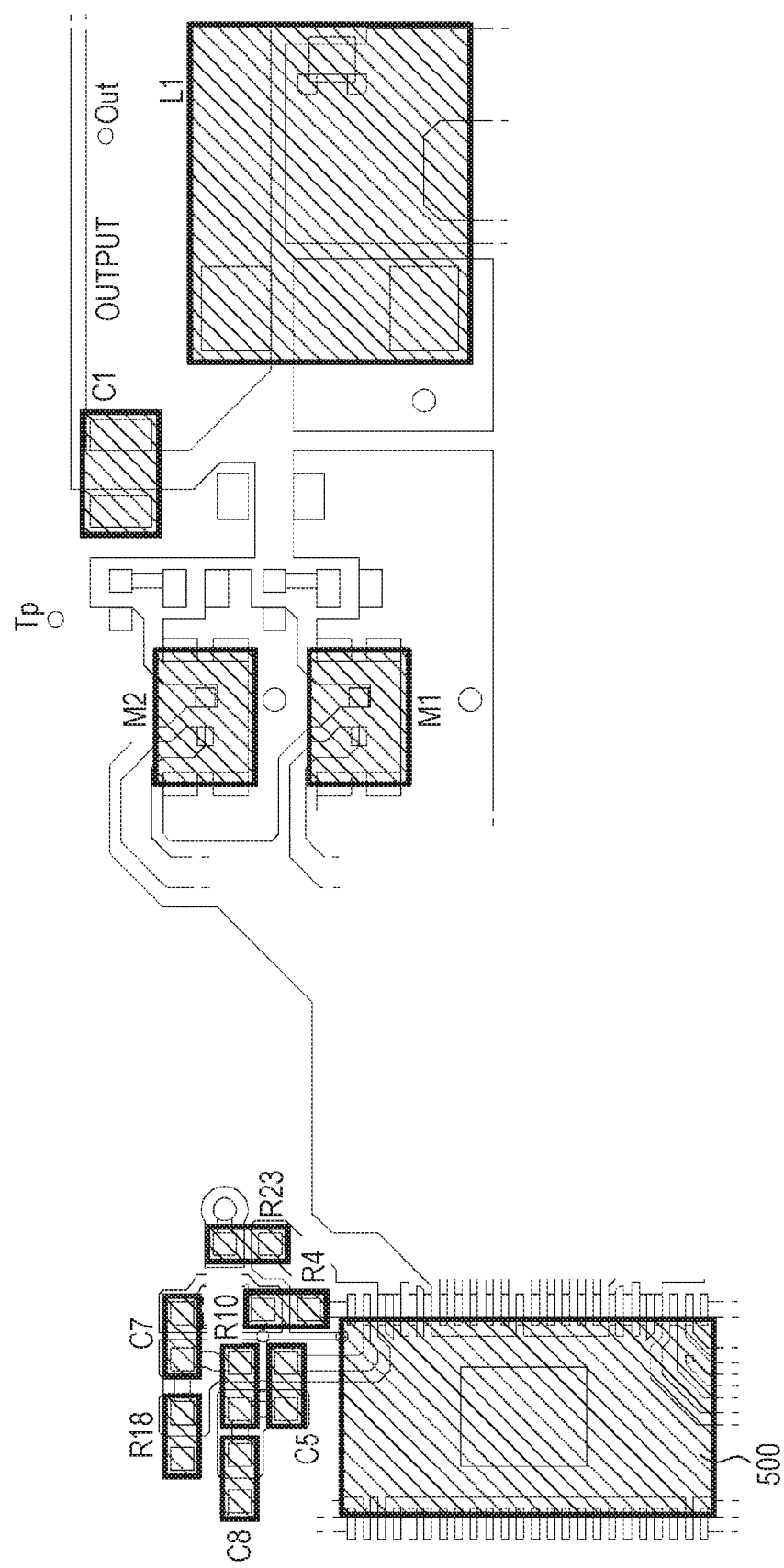
FIG. 20 is a diagram illustrating an arrangement of elements which are mounted on the circuit board.

FIG. 19 is a view illustrating a wiring pattern of the circuit board when viewed in a plan view. FIG. 20 is a diagram illustrating the arrangement of the elements mounted on the circuit board with a relationship with the wiring pattern illustrated in FIG. 19.

As illustrated in FIG. 20, on the circuit board, the LSI 500 which configures the drive circuit 50, the transistors M1 and M2, the inductor L1, the capacitors C1, C5, C7, and C8, and the resistors R4, R10, R18, and R23 are mounted.

In FIG. 19 and FIG. 20, the gate signal output from the pin Hdr of the LSI 500 is supplied to the gate electrode of the transistor M1 through the resistor R1 (omitted in FIG. 19 and FIG. 20). Similarly, the gate signal output from the pin Ldr is supplied to the gate electrode of the transistor M2 through the resistor R2 (omitted in FIG. 19 and FIG. 20).

A terminal X1 which is connected to the other end of the capacitor C1, a terminal X2 which is connected to the source electrode of the transistor M2, a terminal X3 which is connected to the other end of the resistor R18, and a terminal X4 which is connected to the other end of the capacitor C8 are configured to be connected to the ground pattern.

In addition, a through-hole N1 is provided in the pattern (output and terminal Out) that includes a terminal X5 which is connected to the other end of the inductor L1 and a terminal X6 which is connected to one end of the capacitor C1. Meanwhile, a through-hole N2 is provided in the pattern that includes a terminal X7 which is connected to one end of the capacitor C7 and a terminal X8 which is connected to one end of the resistor R4.

In the circuit diagram in FIG. 10, two systems are formed from the terminal Out and returning is performed through the pins Vfb and Ifb of the LSI 500. Practically, as illustrated in FIG. 19, the systems are configured to diverge to one end of the resistor R4 and to one end of the capacitor C7 through the through-hole N1 provided in the pattern including the terminal Out, an insertion wiring pattern (not illustrated), and the through-hole N2 in this order. The path on the resistor R4 side is returned to the pin Vfb and the path on the capacitor C7 side is returned to the pin Ifb.

Here, as illustrated in FIG. 19, when the wiring pattern is referred to as a first layer, the insertion wiring pattern means a wiring pattern configured to be a layer other than the first layer.

A through-hole N3 is provided in a pattern including a terminal X10 which is connected to the drain electrode of the transistor M1. In addition, a through-hole N4 is provided in a pattern including a terminal X11 which is connected to the other end of the resistor R23. The insertion patterns (not illustrated) are connected to the through-holes N3 and N4 and the voltage Vh is applied thereto.

A through-hole N6 is provided in the pattern (connection point Sd in FIG. 10) that includes a terminal X12 which is connected to the source electrode of the transistor M1 and a terminal X13 which is connected to the drain electrode of the transistor M2. A through-hole N7 is provided in the pattern that includes a terminal X14 which is connected to one end of the inductor L1. The through-hole N6 and the through-hole N7 are electrically connected to each other through the insertion wiring pattern (not illustrated).

In the present embodiment, the drive circuit 50 is configured to mount various elements on the circuit board. Here, the LPF 550 is disposed to be close to the terminal Out which is output.

Figure 21:
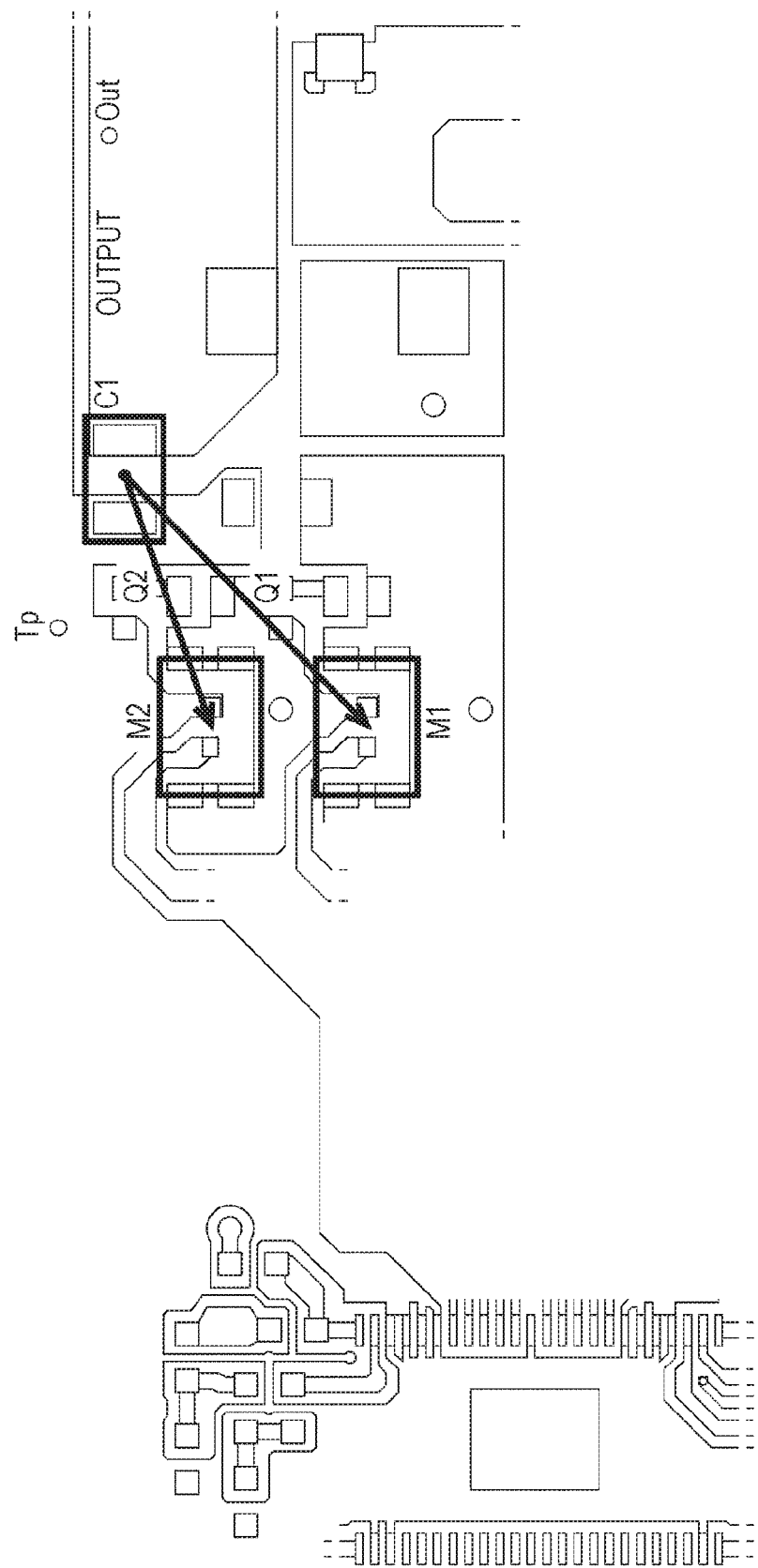
FIG. 21 is a diagram illustrating a positional relationship of the elements mounted on the circuit board.

FIG. 21 is an explanatory diagram illustrating such an arrangement.

As illustrated in FIG. 21, the capacitor C1 that configures the LPF 550 is disposed to be closer to the transistor M2 side than to the transistor M1. To be more specific, the arrangement is performed such that the shortest distance Q2 from the capacitor C1 to the transistor M2 is shorter than the shortest distance Q1 from the capacitor C1 to the transistor M1.

The shortest distance between the elements means, for example, a distance from the (opposite) center point when viewed in a plan view to the center point of a counterpart element in a plan view.

When a reason why such an arrangement is performed is described, a wiring inductance of the pattern which is connected to a terminal of the capacitor C1 is applied to the inductance L52 (parasitic component) in FIG. 14 and then, the influence of a sum of these inductances are suppressed. Next, the influence will be described.

Figure 22:
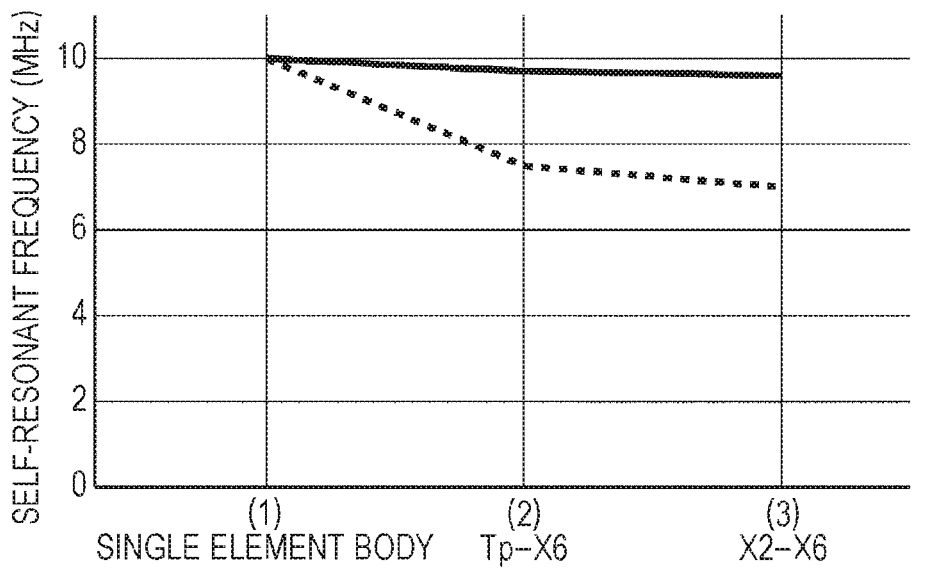
FIG. 22 is a diagram illustrating a self-resonant frequency of the capacitor mounted on the circuit board.

FIG. 22 is a diagram illustrating a self-resonant frequency f cap of the capacitor C1 when the inductance between the two points is considered.

FIG. 22 illustrates a comparison between after improvement (that is, a configuration in which the transistors M1 and M2 and the capacitor C1 as illustrated in FIG. 20 and FIG. 21 are mounted on the ground pattern illustrated in FIG. 19) and before improvement (a configuration in which the ground pattern or the arrangement of the components are not considered).

In addition, between the two points means that (1) a single element (substantially the same as between the terminals X1 to terminal X6 in the embodiment) of the capacitor C1, (2) between a test pin Tp and the terminal X6 in a state where the capacitor C1 is mounted on the circuit board, and (3) between the terminals X2 to X6 in a state where the capacitor C1 is mounted on the circuit board.

The terminal X2 is the closest terminal to the terminal X1 among the terminals which are grounded to the ground in various elements of the drive circuit 50 and it is considered that two points formed with the terminal X1 are dominant compared to an influence between other elements.

FIG. 22 shows that, even when a single element of the capacitor C1 is good in performance (even when the parasitic inductance is small), the wiring inductance is added when the element is actually mounted on the circuit board. Therefore, when a shape of a ground pattern or an arrangement of the elements is inappropriate, the self-resonant frequency f cap of the capacitor C1 deteriorates.

Therefore, in order to increase the self-resonant frequency f cap of the capacitor C1, there is a need to decrease not only the parasitic inductance in a single body but also the wiring inductance on the circuit board.

After the improvement as described in the embodiment is performed, it is possible not to deteriorate the self-resonant frequency f cap of the capacitor C1 in a state of a single element compared to the self-resonant frequency f cap before improvement, even when the element is mounted on the circuit board.

Figure 23:
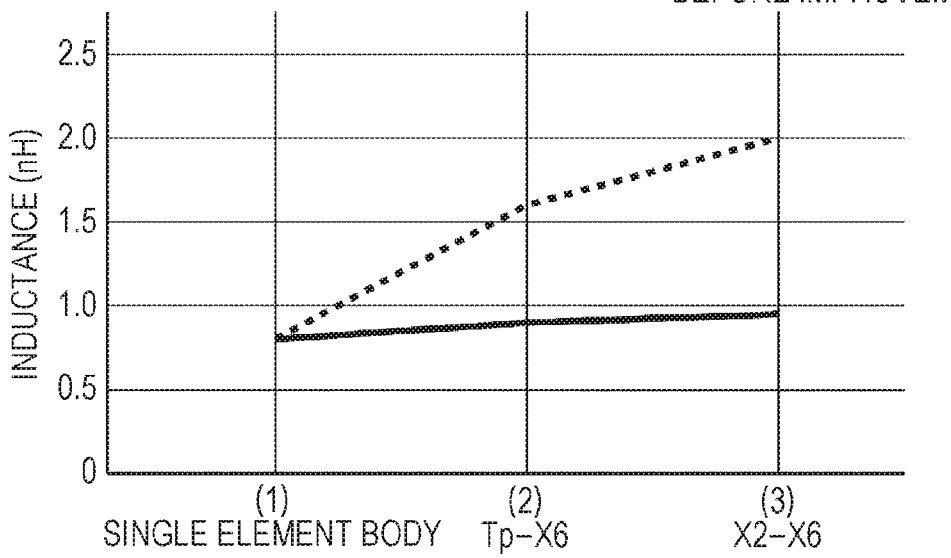
FIG. 23 is a diagram illustrating parasitic inductance and wiring inductance.

FIG. 23 is a diagram showing results of measuring the inductance between two points in the same way as in FIG. 22. In order not to deteriorate the self-resonant frequency f cap of the capacitor C1 as the state after improvement in FIG. 22, it is determined, with reference to FIG. 23, that the inductance may be set as follows. That is, it is determined that the inductance from the terminal X6 which is connected to one end of the capacitor C1 to the terminal X2 which is connected to the source electrode of the transistor M2, in other words, an inductance including the parasitic inductance of the capacitor C1 and the wiring inductance from the terminal X1 which is the other end of the capacitor C1 to the terminal X2 may be equal to or less than 1 nH.

Figure 24:
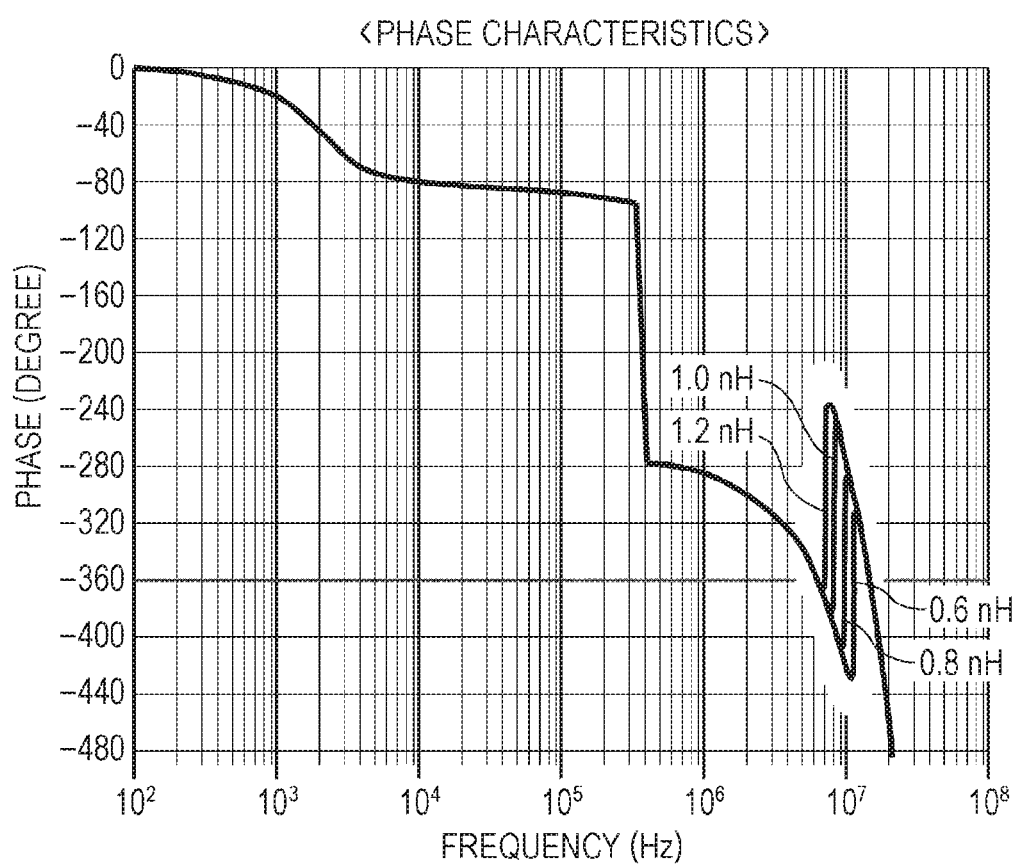
FIG. 24 is a diagram illustrating the impedance characteristic of the capacitor using a relationship with the inductance.

FIG. 24 is a diagram illustrating the phase difference characteristic in the same way as in FIG. 13.

Here, results of simulations are shown by changing the inductance to be 0.6 nH, 0.8 nH, 1.0 nH, or 1.2 nH which includes the parasitic inductance of the capacitor C1 and the wiring inductance from the terminal X1 to the terminal X2.

As illustrated in FIG. 24, when the inductance is higher than 1.0 nH, two frequencies having phase differences around −360 degrees approach each other. Therefore, it is determined that the stability of the self-oscillation is insufficient. In contrast, when the inductance is equal to or less than 1.0 nH, two frequencies having phase differences around −360 degrees are sufficiently separated from each other and thus, the self-oscillation becomes stable.

The invention is not limited to the embodiments described above and various modifications and applications as will be described below can be performed. The aspects of the modifications and applications which will be described below can be used by one or combination of a plurality of aspects which are carefully selected.

In the embodiment, the drive circuit 50 is configured to return the drive signal COM-A (COM-B) which is subjected to smoothing of the amplified modulated signal by the LPF 550 in the generation of the modulated signal Ms; however, the modulated signal Ms itself may be returned. For example, no particular illustration is provided; a configuration may be employed, in which an error between the modulated signal Ms and the input signal As is calculated, the signal which delays the error and the signal Aa which the target are added to each other or subtracted from each other, and a result is input to the comparator 520.

The amplified modulated signal existing at the connection point Sd of the transistors M1 and M2 is different from the modulated signal Ms only in the logic amplitude. Therefore a configuration may be employed, in which, for example, after attenuating the amplified modulated signal, the amplified modulated signal is returned in the same way as the modulated signal Ms.

In addition, in the embodiment illustrated in FIG. 2, for convenience of description, the number of nozzles is set to be relatively small and two drive circuits 50-a and 50-b are configured to output the drive signals COM-A and COM-B, respectively; however, the drive circuits may be provided to further output the drive signals COM-C, COM-D, or the like. That is, the number of the drive circuits is not limited to "2".

According to the printing apparatus 1, the head unit including the plurality of nozzles 651 may not be configured to discharge the ink while reciprocating in the main scanning direction, but may be a so-called line printer in which a plurality of head units having nozzles that are arranged in a direction orthogonal to or oblique to the sub scanning direction are provided and the head units are fixed to a housing.

According to the embodiment, an example of the piezoelectric element 60 that discharges ink is described as a drive target of the drive circuit 50. However, the drive target is not limited to the piezoelectric element 60, but, for example, may be any capacitive load such as an ultrasonic motor, a touch panel, a flat speaker, or a display such as a liquid crystal. That is, the drive circuit 50 may be a capacitive load drive circuit that drives such capacitive loads.

What is claimed is:

1. A drive circuit for driving a capacitive load, comprising:
- a modulation circuit that generates a modulated signal by pulse-modulating a source signal through self-oscillation;
- a pair of transistors that include a high-side transistor and a low-side transistor and amplify the modulated signal to generate an amplified modulated signal; and
- a low-pass filter that includes a capacitor and smooths the amplified modulated signal to generate a drive signal which is applied to the capacitive load,
- wherein the shortest distance between a low-side transistor and the capacitor is shorter than a shortest distance between the high-side transistor and the capacitor.

2. The drive circuit for driving a capacitive load according to claim 1,
  wherein a frequency of the self-oscillation is from 1 MHz to 8 MHz.

3. The drive circuit for driving a capacitive load according to claim 1,
  wherein inductance including parasitic inductance of the capacitor and wiring inductance from the capacitor to the low-side transistor is 1 nH or lower.

4. The drive circuit for driving a capacitive load according to claim 1,
  wherein a self-resonant frequency of the capacitor is higher than a frequency of the self-oscillation.

5. The drive circuit for driving a capacitive load according to claim 1,
  wherein a self-resonant frequency of the capacitor is 1.5 or more times a frequency of the self-oscillation.

* * * * *